(12) United States Patent
Onodera

(10) Patent No.: US 12,100,659 B2
(45) Date of Patent: Sep. 24, 2024

(54) POWER SUPPLY CONDUCTIVE TRACE STRUCTURE OF SEMICONDUCTOR DEVICE AND POWER SUPPLY CONDUCTIVE TRACE LAYOUT METHOD OF SEMICONDUCTOR DEVICE

(71) Applicant: SOCIONEXT INC., Kanagawa (JP)

(72) Inventor: Mitsuru Onodera, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 556 days.

(21) Appl. No.: 17/399,340

(22) Filed: Aug. 11, 2021

(65) Prior Publication Data

US 2022/0051981 A1    Feb. 17, 2022

(30) Foreign Application Priority Data

Aug. 14, 2020   (JP) .................................. 2020-136899

(51) Int. Cl.
*H01L 23/528*   (2006.01)
*G06F 30/392*   (2020.01)

(52) U.S. Cl.
CPC ........ *H01L 23/5286* (2013.01); *G06F 30/392* (2020.01)

(58) Field of Classification Search
CPC ............................ H01L 23/5286; G06F 30/392
See application file for complete search history.

(56) References Cited

U.S. PATENT DOCUMENTS

| | | | |
|---|---|---|---|
| 9,462,674 B1* | 10/2016 | Fakhruddin | ........... G06F 30/347 |
| 2004/0073878 A1* | 4/2004 | Hasegawa | ............... G06F 30/39 |
| | | | 716/120 |
| 2011/0239180 A1 | 9/2011 | Sode | |
| 2014/0289693 A1 | 9/2014 | Koduri et al. | |
| 2016/0027691 A1* | 1/2016 | Liu | .................. H01L 21/76816 |
| | | | 257/774 |

FOREIGN PATENT DOCUMENTS

| | | |
|---|---|---|
| JP | 2004-139181 A | 5/2004 |
| JP | 2011-204086 A | 10/2011 |
| JP | 2014-186734 A | 10/2014 |

OTHER PUBLICATIONS

Notice of Reasons for Refusal dated Jun. 25, 2024 issued in the corresponding Japanese Patent Application No. 2020-136899, with English machine translation.

* cited by examiner

*Primary Examiner* — Walter H Swanson
*Assistant Examiner* — Jacob T Nelson
(74) *Attorney, Agent, or Firm* — Rimon P.C.

(57) ABSTRACT

A power supply conductive trace structure of a semiconductor device includes a first power supply conductive trace in a mesh form provided in a first power supply conductive trace layer, and a second power supply conductive trace provided in a redistribution layer located on or above the first power supply conductive trace to correspond in position to a conductive trace area that is a portion of the first power supply conductive trace and to be connected to the first power supply conductive trace.

9 Claims, 31 Drawing Sheets

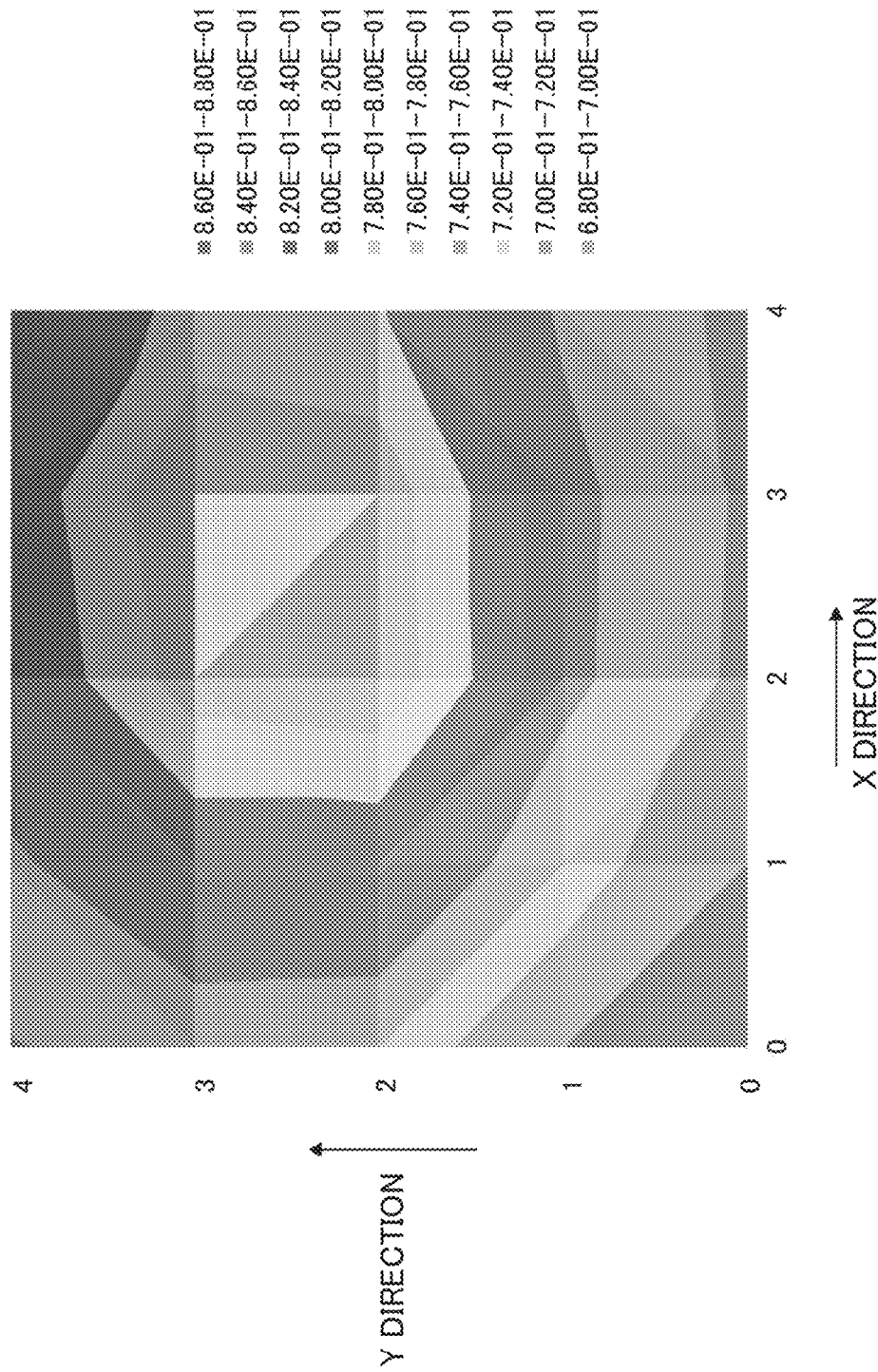

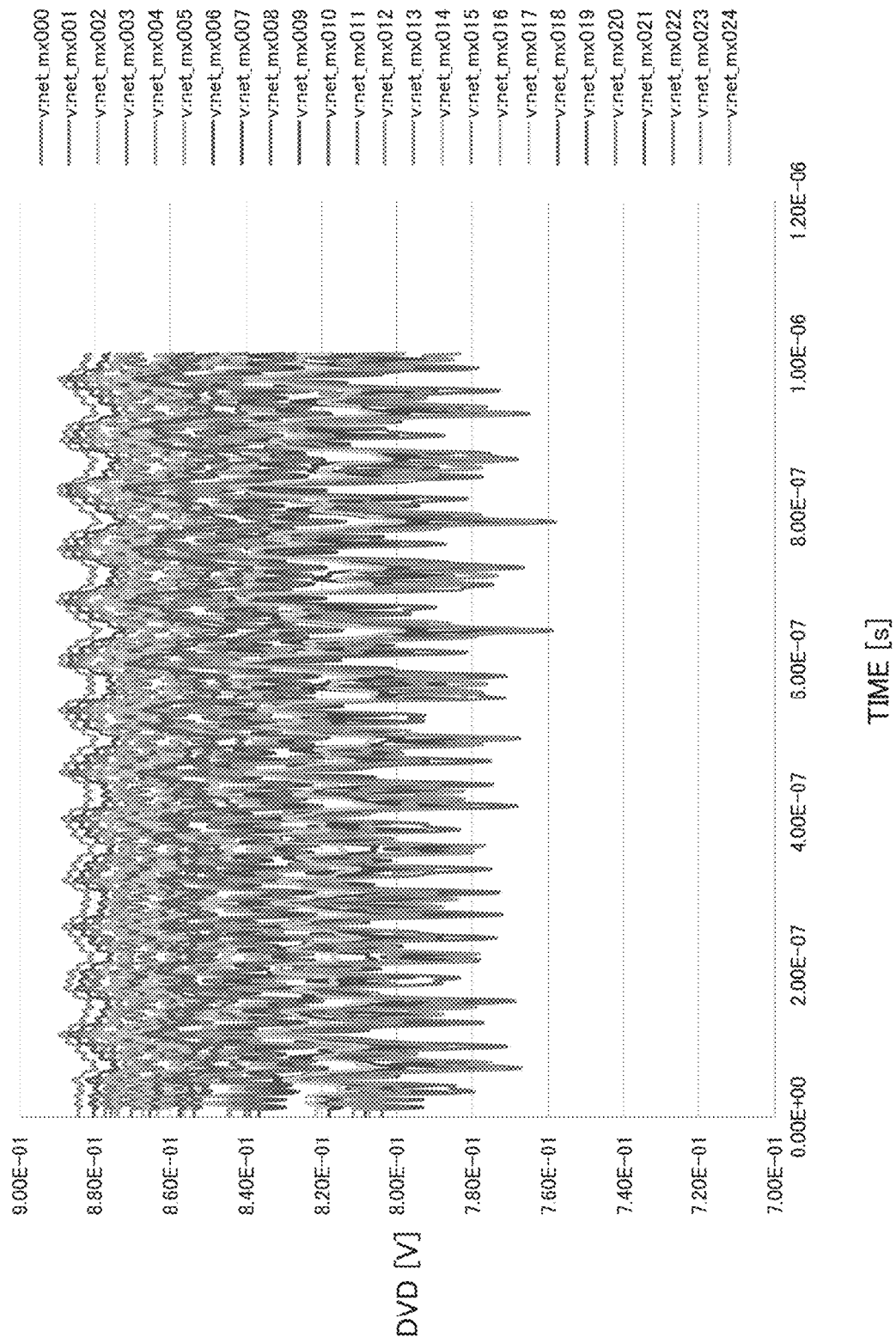

POWER SUPPLY CONDUCTIVE TRACE STRUCTURE OF SEMICONDUCTOR DEVICE AND POWER SUPPLY CONDUCTIVE TRACE LAYOUT METHOD OF SEMICONDUCTOR DEVICE

CROSS-REFERENCE TO RELATED APPLICATION

The present application claims priority to Japanese Patent Application No. 2020-136899, filed on Aug. 14, 2020, which is incorporated herein by reference in its entirety.

FIELD

The present disclosure relates to a power supply conductive trace structure of a semiconductor device and a power supply conductive trace layout method of the semiconductor device.

BACKGROUND

For semiconductor devices, layout techniques for alleviating voltage drops and solving IR (voltage) drop violations have been suggested.

SUMMARY

According to an aspect of an embodiment of the present disclosure, a power supply conductive trace structure of a semiconductor device includes a first power supply conductive trace in a mesh form provided in a first power supply conductive trace layer, and a second power supply conductive trace provided in a redistribution layer located on or above the first power supply conductive trace to correspond in position to a conductive trace area that is a portion of the first power supply conductive trace and to be connected to the first power supply conductive trace.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 30 is a two-dimensional graph illustrating a simulation result of dynamic voltage drop of the semiconductor device having the power supply conductive trace structure of FIG. 24; and FIG. 31 is a waveform diagram illustrating a simulation result of temporal change of dynamic voltage drop of the semiconductor device having the power supply conductive trace structure of FIG. 24.

DESCRIPTION OF EMBODIMENTS

For semiconductor devices, a layout technique for alleviating voltage drop by extracting an area in which a degree of voltage drop exceeds a predetermined threshold value on the basis of simulation in the stage of layout design and adding power supply conductive traces for the extracted area and connection points of the power supply conductive traces has been suggested. Also, in semiconductor devices, a layout technique for solving an IR drop violation by changing a resistance value of an electric current path flowing into a node with the maximum IR drop violation on the basis of voltage values of multiple nodes which are connection points of power supply conductive traces laid out in a mesh form has been suggested. (For example, see Japanese Laid-open Patent Publication No. 2004-139181 and Japanese Laid-open Patent Publication No. 2011-204086.)

Conventionally, in order to prevent problems such as malfunction due to voltage drop in semiconductor devices, power supply conductive traces are added to a power supply conductive trace layer based on simulation in the stage of layout design to reduce the power supply resistance. However, the operating frequencies of semiconductor devices tend to increase year by year, and problems due to voltage drops are becoming more likely to occur.

For this reason, even though the voltage drop is verified at the time of layout design, a defect due to the voltage drop may be found in the operation test for testing a prototype of a semiconductor device. In a case where a problem occurs due to voltage drop in the prototype of the semiconductor device, it is necessary to perform the layout design again from the designing of the layout layer of the semiconductor board, for example, by adding a decoupling capacity. In a case where the layout design is performed again from the designing of the semiconductor circuit board, the cost of the prototype increases, and it takes a longer time to prepare the prototype, which will increase the designing cost.

In view of the above problems, it is desired to alleviate local voltage drop in a semiconductor device with less increase in the designing cost.

Hereinafter, embodiments are described with reference to drawings.

First Embodiment

Figure 1:
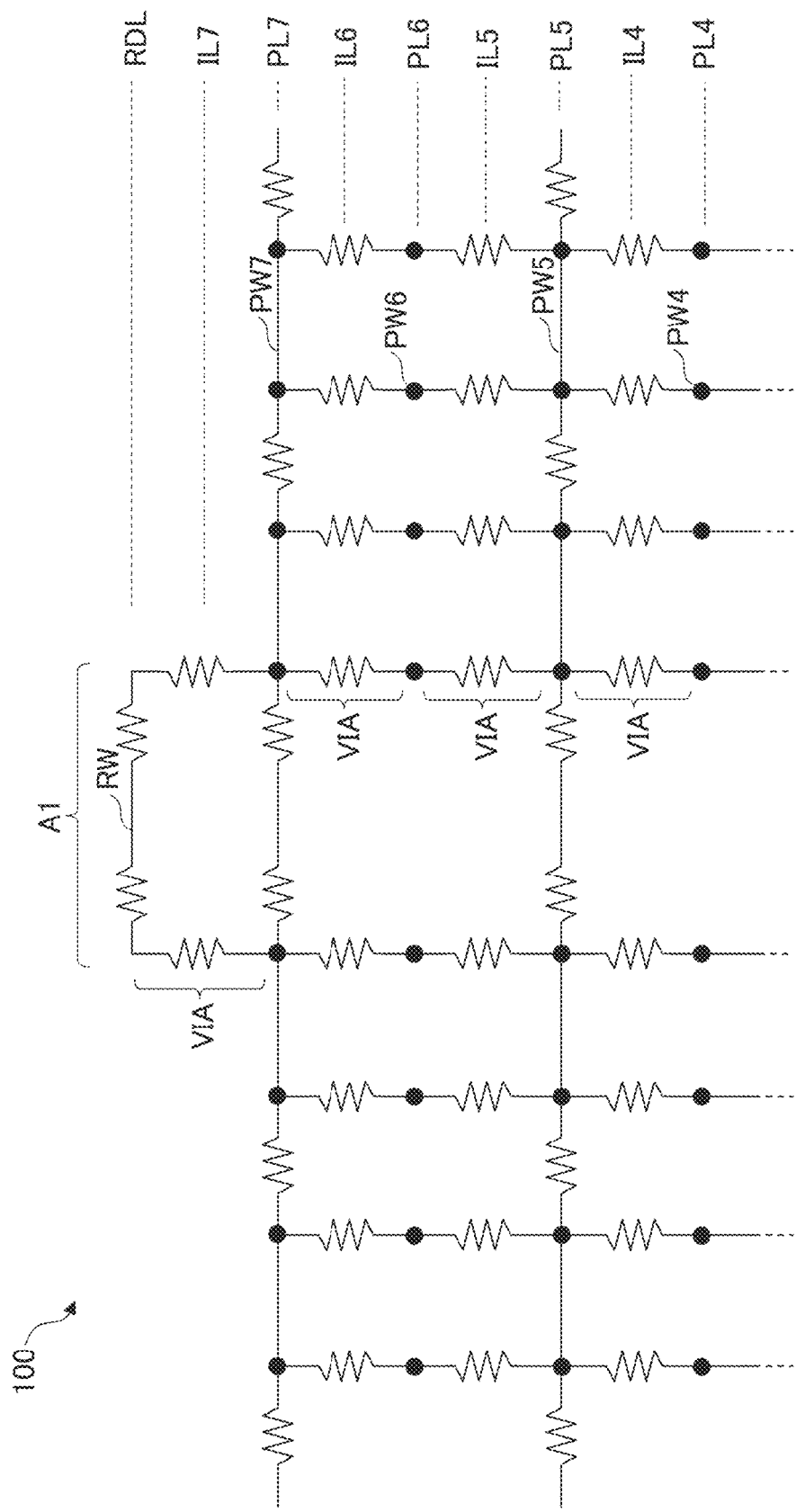
FIG. 1 is a schematic view illustrating an example of a power supply conductive trace structure of a semiconductor device according to a first embodiment.

FIG. 1 illustrates an example of a power supply conductive trace structure of a semiconductor device according to the first embodiment. The semiconductor device 100 having the power supply conductive trace structure illustrated in FIG. 1 is a large-scale integrated circuit such as, for example, a system on a chip (SoC), an application-specific standard product (ASSP), an application-specific integrated circuit (ASIC), or a processor, and operates at a clock frequency of several hundred MHz or higher. FIG. 1 illustrates a power supply conductive trace structure when the semiconductor device 100 is seen from a cross-sectional direction, with the lower side of FIG. 1 being a back surface (a semiconductor circuit board) side of the semiconductor chip, and with the upper side of FIG. 1 being a front surface side of the semiconductor chip.

For example, the semiconductor device 100 includes multiple power supply conductive trace layers PL (PL7, PL6, PL5, . . . ) and a redistribution layer RDL. In addition, the semiconductor device 100 includes insulating layers IL (IL7, IL6, IL5, IL4, . . . ) disposed between the power supply conductive trace layers PL adjacent to each other (or between the redistribution layer RDL and the power supply conductive trace layers PL). The redistribution layer RDL is arranged with a power supply conductive trace RW, and each of the power supply conductive trace layers PL is arranged with a power supply conductive trace PW (PW7, PW6, PW5, PW4, . . . ). The power supply conductive trace layer PL7 is an example of a first power supply conductive trace layer, and the power supply conductive trace layer PL6 is an example of a second power supply conductive trace layer.

Each of the insulating layers IL is arranged with vias VIA connecting two power supply conductive traces PW (or RW) arranged to face each other with the insulating layer IL interposed therebetween. The power supply conductive trace PW7 for a power supply voltage VDD provided in the power supply conductive trace layer PL7 is an example of a first power supply conductive trace. The power supply conductive trace RW arranged in the redistribution layer RDL is an example of a second power supply conductive trace. The power supply conductive trace PW6 for the power supply voltage VDD arranged in the power supply conductive trace layer PL6 is an example of a third power supply conductive trace.

The power supply conductive trace layers PL7, PL5 are arranged with the power supply conductive traces PW7, PW5, respectively, extending in the horizontal direction of FIG. 1. The power supply conductive traces PW7, PW5 are arranged with a predetermined interval in the depth direction of FIG. 1 (i.e., a direction perpendicular to the sheet surface of the drawing). The power supply conductive trace layers PL6, PL4 are arranged with the power supply conductive traces PW6, PW4 extending in the depth direction of FIG. 1. The power supply conductive traces PW6, PW4 are arranged with a predetermined interval in the horizontal direction of FIG. 1. In this manner, the power supply conductive trace structure in the mesh form is constituted by the power supply conductive traces PW crossing each other and arranged in the two power supply conductive trace layers PL adjacent to each other.

In FIG. 1, the power supply conductive traces PW7, PW5, RW are indicated by solid lines, resistance symbols, and black points. The power supply conductive traces PW6, PW4 are indicated by black points. The vias VIA arranged in the respective insulating layers IL7 to IL5 are indicated by solid lines and resistance symbols. The resistance values of the respective power supply conductive traces PW (PLW-PLW), the number of vias VIA, and the arrangement positions of the vias VIA are configured by a layout design tool that is used when the layout is designed. In FIG. 1, the power supply conductive trace layers PL closer to the semiconductor circuit board than is the power supply conductive trace layer PL4 are not illustrated.

In the actual implementation, in the semiconductor device 100, each of the power supply conductive trace layers PL is arranged with a power supply conductive trace PW for supplying the power supply voltage VDD and a power supply conductive trace PW for supplying a ground voltage VSS. However, FIG. 1 illustrates only the power supply conductive traces PW for supplying the power supply voltage VDD. In the redistribution layer RDL, only the power supply conductive trace RW for supplying the power supply voltage VDD is arranged. In the actual implementation, a signal conductive trace layer (not illustrated) including signal lines and a power supply conductive trace layer (not illustrated) including ground lines is provided between two power supply conductive trace layers PL adjacent to each other.

In a case where one of the power supply conductive trace PW for the power supply voltage VDD or the power supply conductive trace PW for the ground voltage VSS is provided in each of the power supply conductive trace layers PL, the power supply conductive trace layer PL may be formed with power supply conductive traces PW in the mesh form crossing each other.

In this embodiment, the power supply conductive trace RW arranged in the redistribution layer RDL is provided locally in a conductive trace area A1, which is a portion of the power supply conductive traces PW7, PL6 arranged in the mesh form in the power supply conductive trace layers PL7, PL6. The power supply conductive trace RW arranged in the redistribution layer RDL is connected in parallel with the power supply conductive trace PW7 through multiple vias VIA arranged in the insulating layer IL7. Accordingly, in the conductive trace area A1, the conductive trace resistance of the power supply conductive trace PW7 can be reduced locally. Also, the power supply conductive trace PW6 is connected to the power supply conductive trace PW7 of the power supply conductive trace layer PL7 through multiple vias VIA in the insulating layer IL6. Therefore, in the conductive trace area A1, the conductive trace resistance of the power supply conductive trace PW6 can be reduced locally.

For example, the conductive trace area A1 is a location in which a dynamic voltage drop (DVD) greater than expected has occurred in an electrical evaluation that is conducted with a prototype semiconductor device that does not include the redistribution layer RDL and the insulating layer IL7. The power supply conductive trace RW is provided locally at the location in which this dynamic voltage drop greater than expected has occurred, and the power supply conductive trace RW is connected to the power supply conductive trace PW7 through the vias VIA, so that the dynamic voltage drop can be alleviated by adding minimum photomasks (reticles) for the conductive trace layer and the insulating layer.

In this case, it is not necessary to change the layout layers lower than the power supply conductive trace layer PL7, of which layout has already been designed. For this reason, the increase in the cost related to redesign of the semiconductor device can be reduced. Examples of costs related to redesign include a time required for redesign, photomasks (reticles) revised or newly made in the redesign, the cost for manufacturing redesigned semiconductor devices, and the like.

Figure 2:
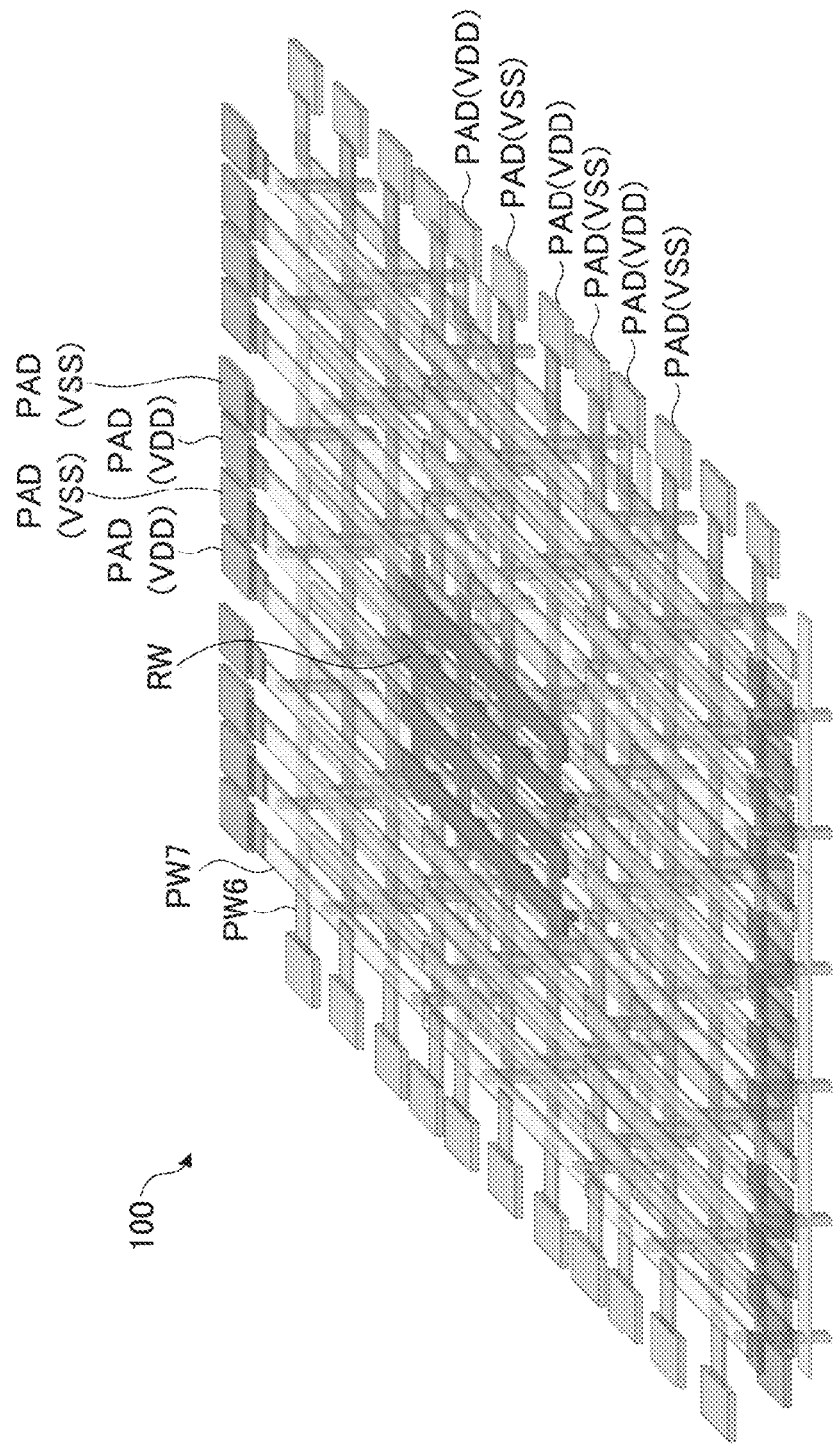
FIG. 2 is a partial perspective view illustrating an example of a power supply conductive trace layout of the semiconductor device having the power supply conductive trace structure of FIG. 1.

FIG. 2 illustrates an example of a power supply conductive trace layout of the semiconductor device 100 having the power supply conductive trace structure of FIG. 1. The power supply conductive trace PW7 is wired from the lower left side to the upper right side of FIG. 2, and is connected to pads PAD arranged on the upper side and the lower side of FIG. 2. The power supply conductive trace PW6 is wired from the left side to the right side of FIG. 2, and is connected to pads PAD arranged on the left side and the right side of FIG. 2.

In the power supply conductive trace layer PL7, the power supply conductive traces PW7 for the power supply voltage VDD and the ground voltage VSS are arranged alternately. In the power supply conductive trace layer PL6, the power supply conductive traces PW6 for the power supply voltage VDD and the ground voltage VSS are arranged alternately. The pads PAD for the power supply voltage VDD and the pads PAD for the ground voltage VSS are arranged alternately in an outer peripheral portion of the semiconductor device 100.

In the example as illustrated in FIG. 2, the power supply conductive trace RW is provided at an approximate center of the semiconductor device 100. In other words, the conductive trace area A1 illustrated in FIG. 1, i.e., the location in which a dynamic voltage drop greater than expected has occurred in a prototype product prior to the manufacturing of the semiconductor device 100, is located at an approximate center of the semiconductor chip. However, the power supply conductive trace RW is not limited to be provided at the approximate center of the semiconductor chip.

Figure 3:
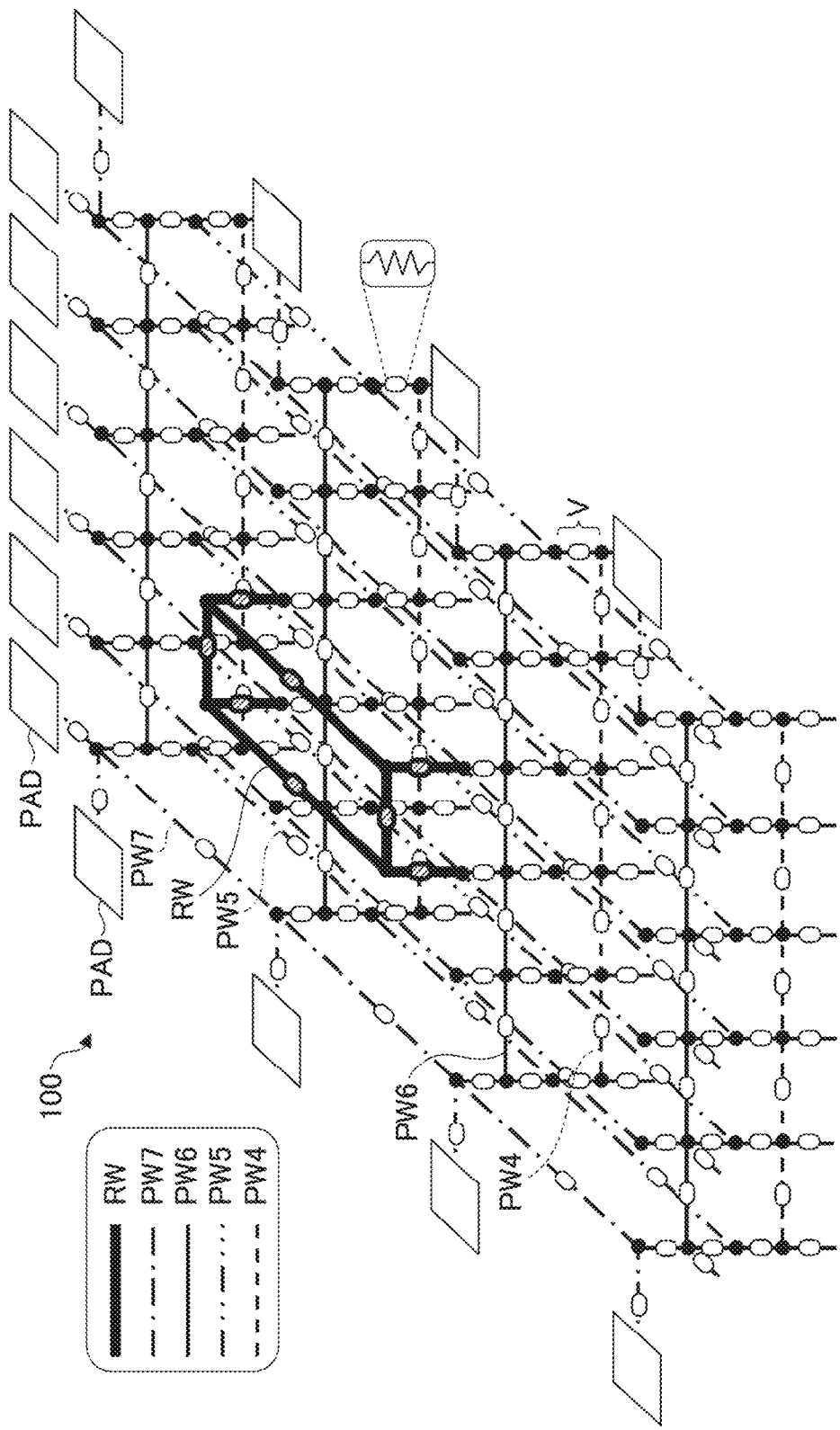
FIG. 3 is a schematic view illustrating an example of a resistance netlist of the power supply conductive trace structure of FIG. 2.

FIG. 3 illustrates an example of a resistance netlist of the power supply conductive trace structure of FIG. 2. In the example as illustrated in FIG. 3, the power supply conductive trace PW7 is indicated by a long dashed short dashed line, and the power supply conductive trace PW6 is indicated by a solid line. The power supply conductive trace PW5 is indicated by a long dashed double-short dashed line, and the power supply conductive trace PW4 is indicated by a broken line.

The power supply conductive trace RW and the vias VIA connecting the power supply conductive trace RW to the power supply conductive trace PW7 are indicated by thick solid lines. The resistance components of the power supply conductive traces PW, RW and the resistance components of the vias VIA are indicated by eclipses. The resistance components of the vias VIA connecting the power supply conductive trace RW to the power supply conductive trace PW7 are indicated by shaded eclipses.

When the power supply conductive traces PW are arranged in the mesh form in the multiple power supply conductive trace layers PL, the resistance values of the power supply conductive traces PW can be uniformized in the semiconductor chip. However, depending on the operation frequency and the like, circuits in the semiconductor chip are different in the amounts of charge-and-discharge electric currents of transistors per unit time. Therefore, each circuit requires a different amount of dynamic electric current, and the amounts of electric currents flowing to the power supply conductive traces PW are different depending on the positions of the power supply conductive traces PW. In this embodiment, the power supply conductive trace RW is arranged in the redistribution layer RDL, which can compensate for the shortage in the amounts of electric currents that are to be passed through the power supply conductive traces PW.

Figure 4:
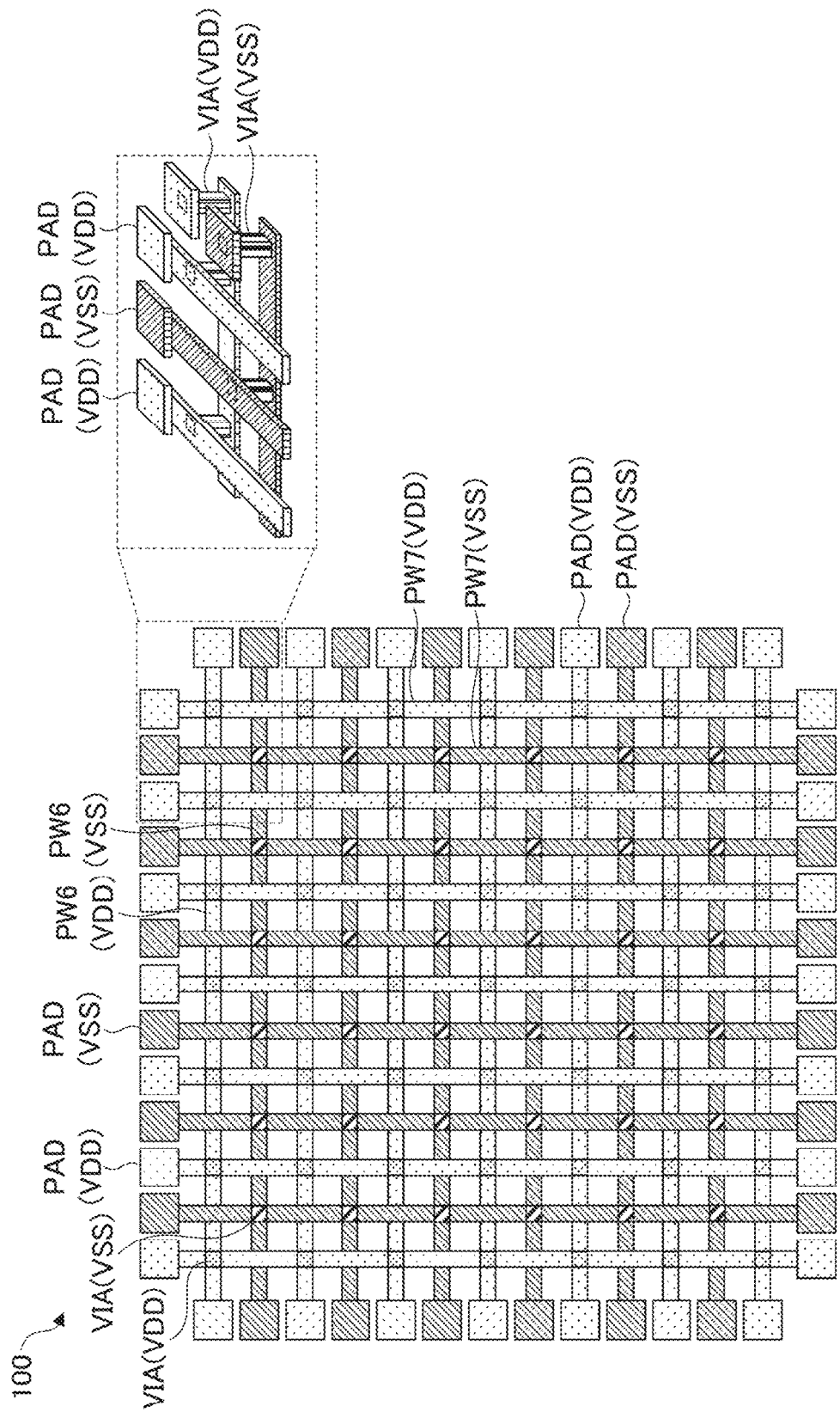
FIG. 4 is an explanatory drawing illustrating an example of connections between power supply conductive traces and pads in the power supply conductive trace structure of FIG. 1.

FIG. 4 illustrates an example of connections between the power supply conductive traces PW7, PW6 and the pads PAD in the power supply conductive trace structure of FIG. 1. The number of pads PAD of FIG. 4 is different from FIG. 2. The power supply conductive traces PW7, PW6 for the power supply voltage are connected with each other through the vias VIA arranged at the crossing points. Likewise, the power supply conductive traces PW7, PW6 for the ground voltage VSS are connected with each other through the vias VIA arranged at the crossing points. Therefore, the power supply conductive traces PW7, PW6 for the power supply voltage VDD and the power supply conductive traces PW7, PW6 for the ground voltage VSS have mesh-form structures.

With the power supply conductive trace structure in the mesh form, certain amounts of power can be supplied to circuits including transistors arranged in the semiconductor device 100. However, depending on the function and operation states of the circuit, charge-and-discharge electric currents of transistors are different, and accordingly, the amounts of voltage drops of the power supply conductive traces PW for the power supply voltage VDD are different depending on the positions in the semiconductor device 100. The dynamic voltage drop is likely to increase in accordance with an increase in the clock frequency of the semiconductor device 100.

Figure 5:
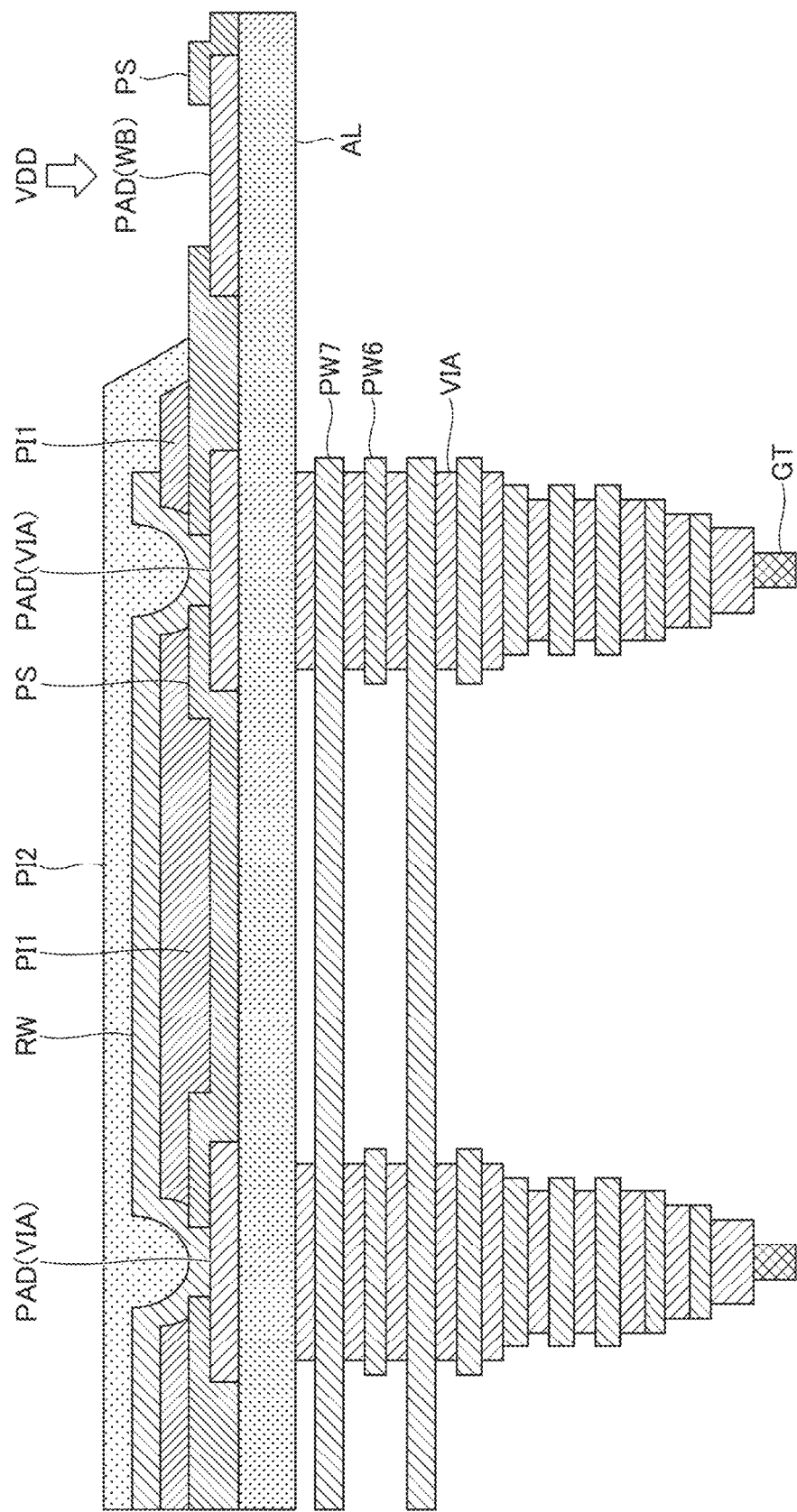
FIG. 5 is a partial cross-sectional view illustrating an example of a semiconductor device having the power supply conductive trace structure of FIG. 1.

FIG. 5 illustrates an example of a cross-sectional structure of the semiconductor device 100 having the power supply conductive trace structure of FIG. 1. The semiconductor device 100 includes an aluminum conductive trace AL for transmitting, to the inside of the semiconductor device 100, the power supply voltage VDD supplied from the outside of the semiconductor device 100 via the pads PAD (WB) connected to gold wires and the like. The aluminum conductive trace AL is connected to the power supply conductive traces PW through the vias VIA, and is connected to the power supply conductive trace RW of the redistribution layer RDL through pads PAD (VIA) for the vias. For example, the material of the pads PAD is aluminum, and the material of the power supply conductive traces RW, PW and the vias VIA is copper.

Accordingly, the power supply conductive trace RW of the redistribution layer RDL is connected to the power supply conductive trace PW7. The power supply voltage VDD supplied to the pads PAD (WB) is supplied to gates GT of transistors, drains of transistors (a diffusion layer of a semiconductor circuit board not illustrated), and the like.

The front surface of the semiconductor device 100 is covered with a polyimide film PI2 except for the arrangement area of the pads PAD (WB). The aluminum conductive trace AL is covered with a passivation film PS except for the pads PAD (WB) and the PADs (VIA). A polyimide film PI1 is formed between the passivation film PS and the power supply conductive trace RW or the polyimide film PI2.

Figure 6:
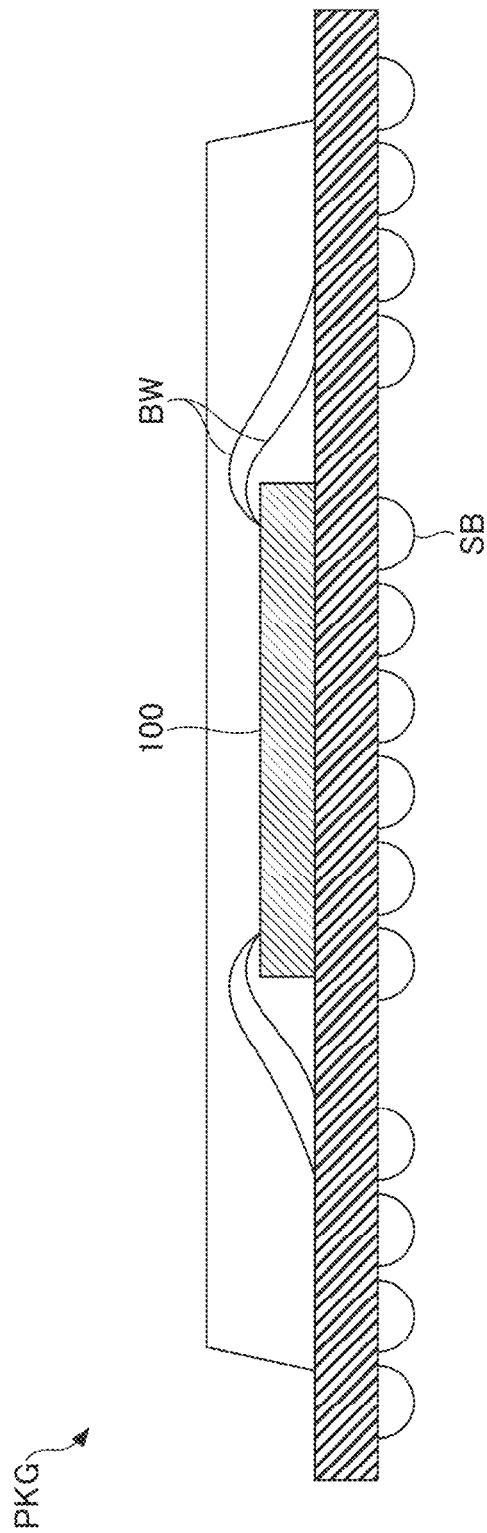
FIG. 6 is a cross sectional view illustrating an example of a package structure of the semiconductor device having the power supply conductive trace structure of FIG. 1.

FIG. 6 illustrates an example of a package structure of the semiconductor device 100 having the power supply conductive trace structure of FIG. 1. For example, the semiconductor device 100 (the semiconductor chip) is contained in a BGA (Ball Grid Array) package PKG. The semiconductor device 100 bonded to a ceramic circuit board BRD and the like is connected through bonding wires BW to solder balls SB provided on the back surface of the ceramic circuit board BRD and the like. The entire BGA package PKG, on which the semiconductor device 100 is mounted, may be referred to as the semiconductor device 100.

Figure 7:
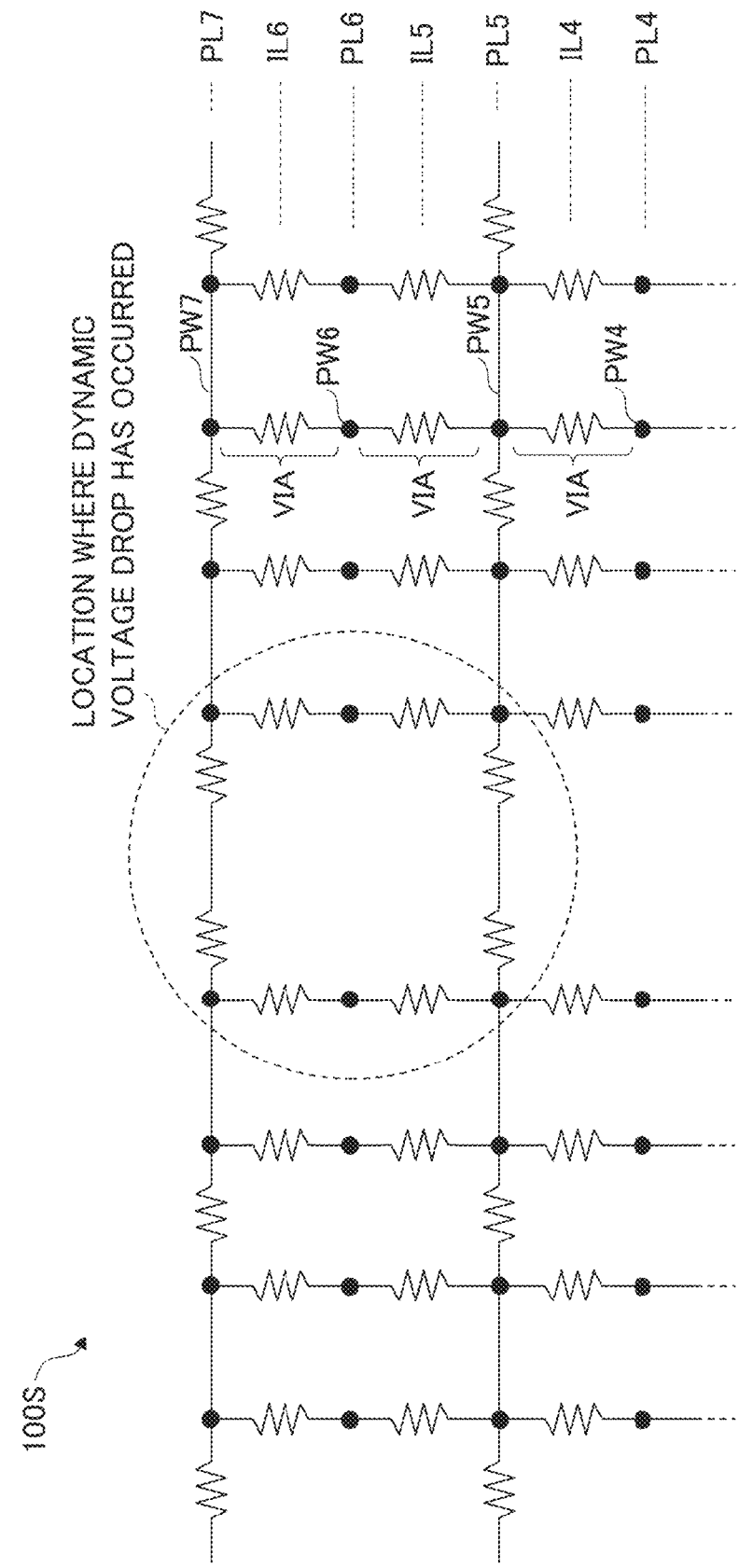
FIG. 7 is an explanatory drawing illustrating an example of a power supply conductive trace structure of a semiconductor device in a prototype stage before optimization to the power supply conductive trace structure of FIG. 1.

FIG. 7 illustrates an example of a power supply conductive trace structure of a semiconductor device 100S in a prototype stage before optimization to the power supply conductive trace structure of FIG. 1. The semiconductor device 100S in the prototype stage as illustrated in FIG. 7 is similar to the power supply conductive trace structure of the semiconductor device 100 of FIG. 1 except that the semiconductor device 100S does not include the redistribution layer RDL and the insulating layer IL7 of FIG. 1. The semiconductor device 100S is an example of a second semiconductor device.

An area indicated by a circle of a broken line corresponds to the conductive trace area A1 illustrated in FIG. 1, and indicates, in an evaluation of electric characteristics (including operation tests) after the semiconductor device 100S has been manufactured as a prototype, a location in which a dynamic voltage drop greater than expected has occurred in the power supply conductive traces PW. The dynamic voltage drop is likely to occur in a case where the amounts of charge-and-discharge electric currents of transistors provided on the semiconductor circuit board corresponding to the location in which the dynamic voltage drop greater than expected has occurred are high. When the amounts of the electric power supply currents supplied to the transistors decrease due to the occurrence of the dynamic voltage drop, the operating margin increases, and accordingly, the operation test of the semiconductor device 100S may fail.

Figure 8:
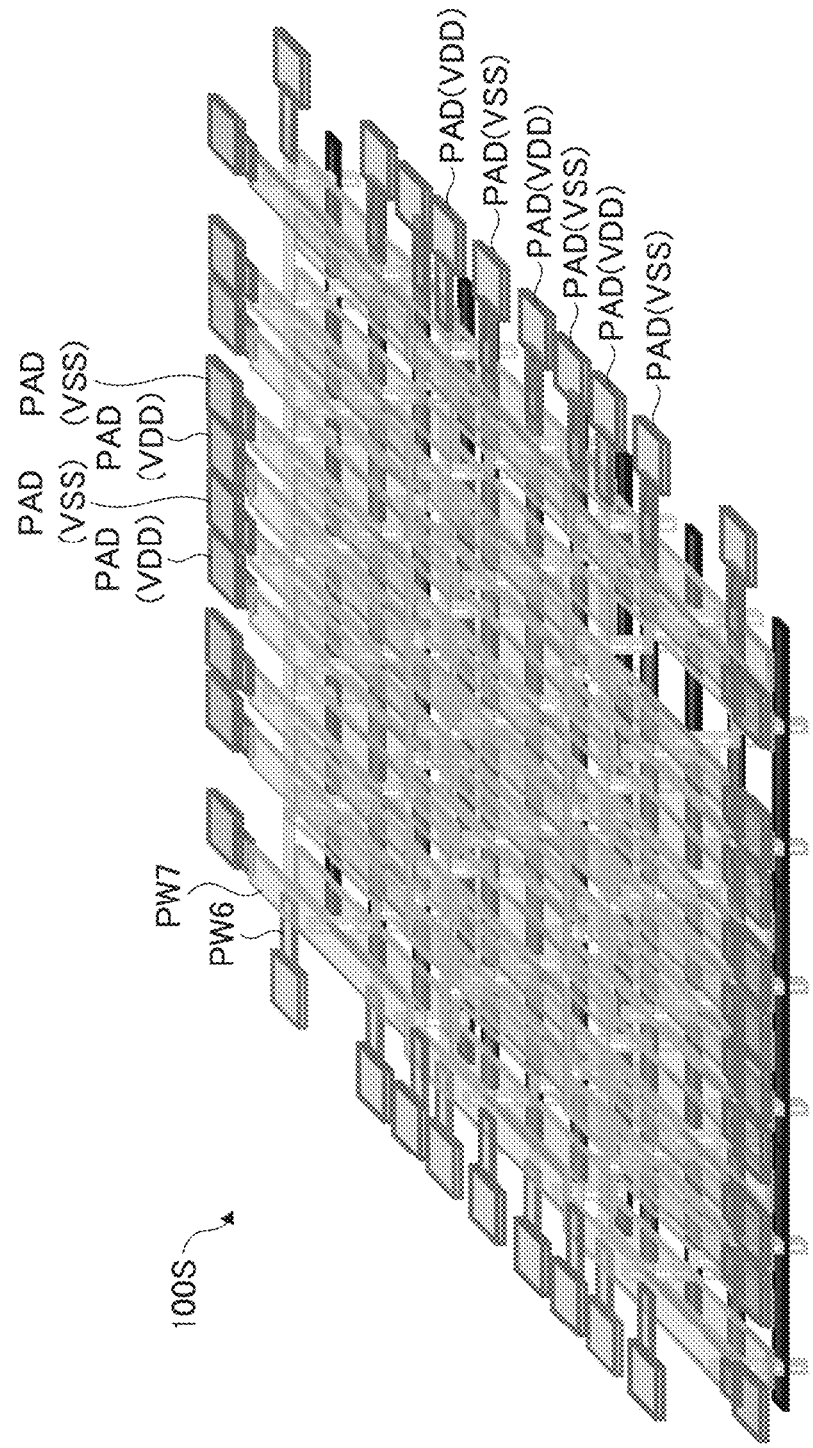
FIG. 8 is a partial perspective view illustrating an example of a power supply conductive trace layout of the semiconductor device having the power supply conductive trace structure of FIG. 7.

FIG. 8 illustrates an example of a power supply conductive trace layout of the semiconductor device having the power supply conductive trace structure of FIG. 7. FIG. 8 is similar to FIG. 1 except that the power supply conductive trace RW as illustrated in FIG. 2 is not provided.

Figure 9:
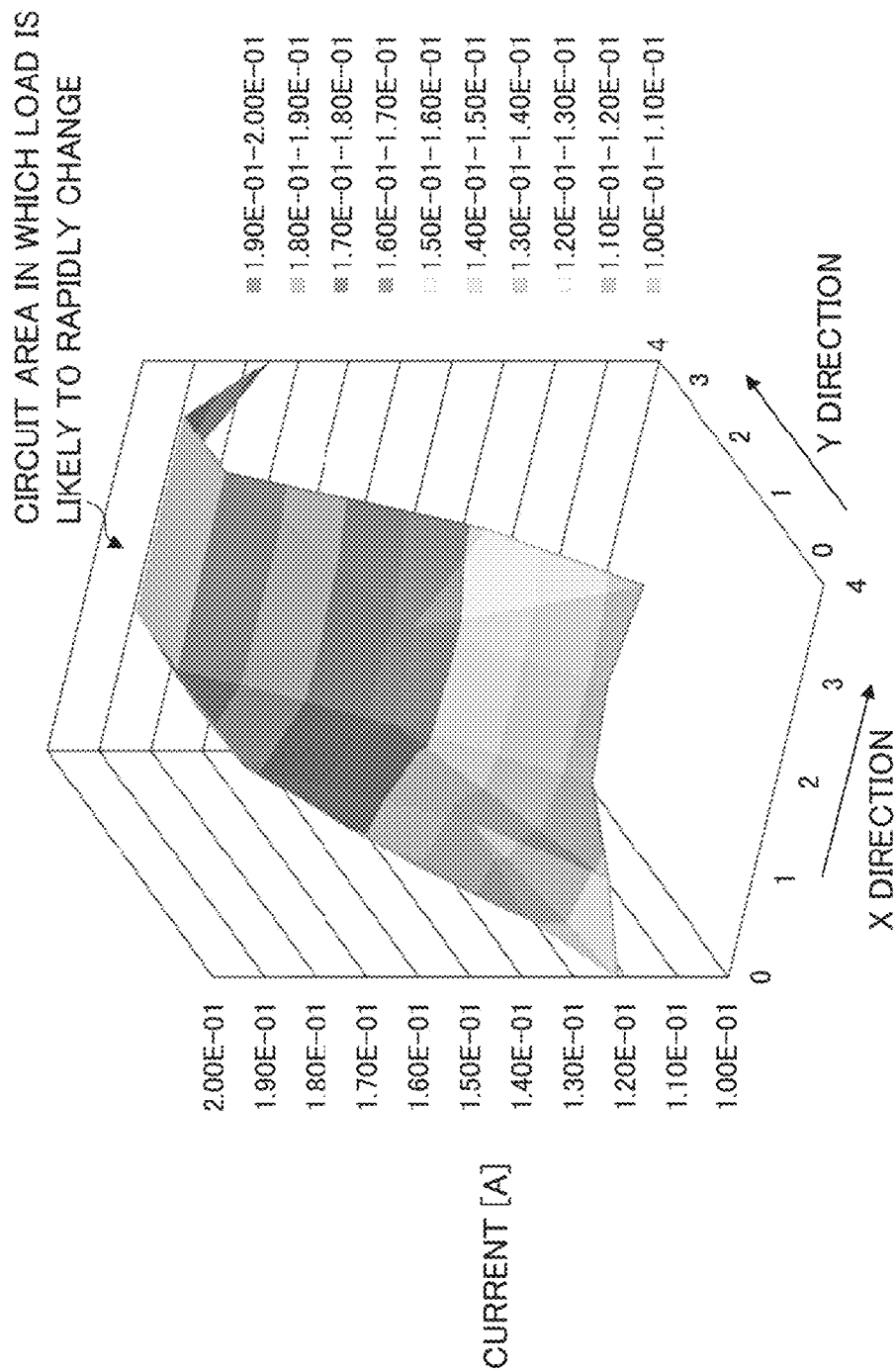
FIG. 9 is a three-dimensional graph illustrating a simulation result of load variation of the semiconductor device having the power supply conductive trace structure of FIG. 7.
Figure 10:
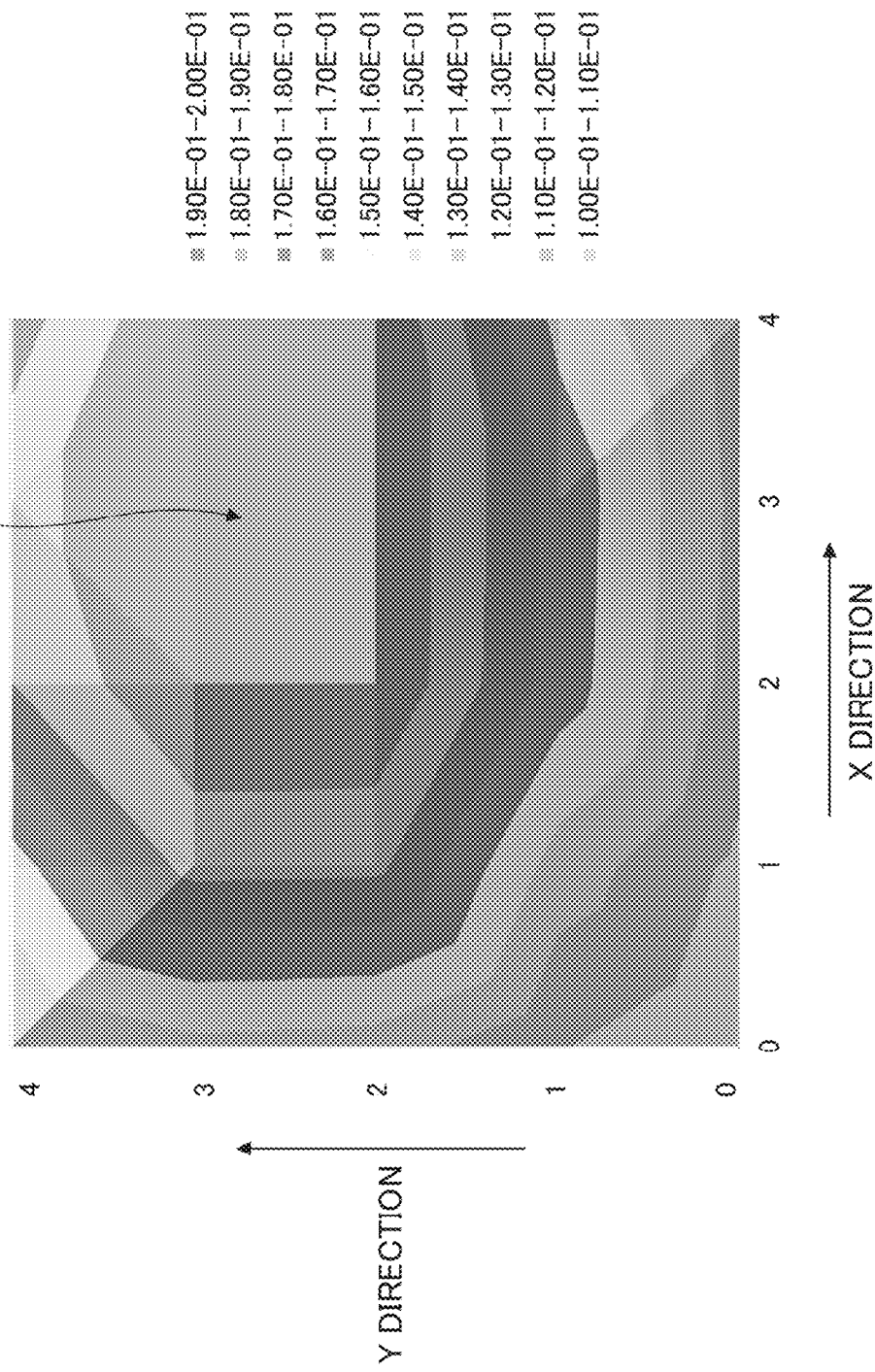
FIG. 10 is a two-dimensional graph illustrating a simulation result of load variation of the semiconductor device having the power supply conductive trace structure of FIG. 7.

FIG. 9 and FIG. 10 illustrate simulation results (a three-dimensional graph and a two-dimensional graph) of load variations of the semiconductor device 100S having the power supply conductive trace structure of FIG. 7. In FIG. 9 and FIG. 10, a rectangular area indicated by the X direction and the Y direction corresponds to the circuit area of the semiconductor device 100S. It is indicated that, in each circuit area, for example, the electric current from the load connected to the drain of the transistor is likely to rapidly increase according to an increase in the operation rate of the circuit.

Figure 11:
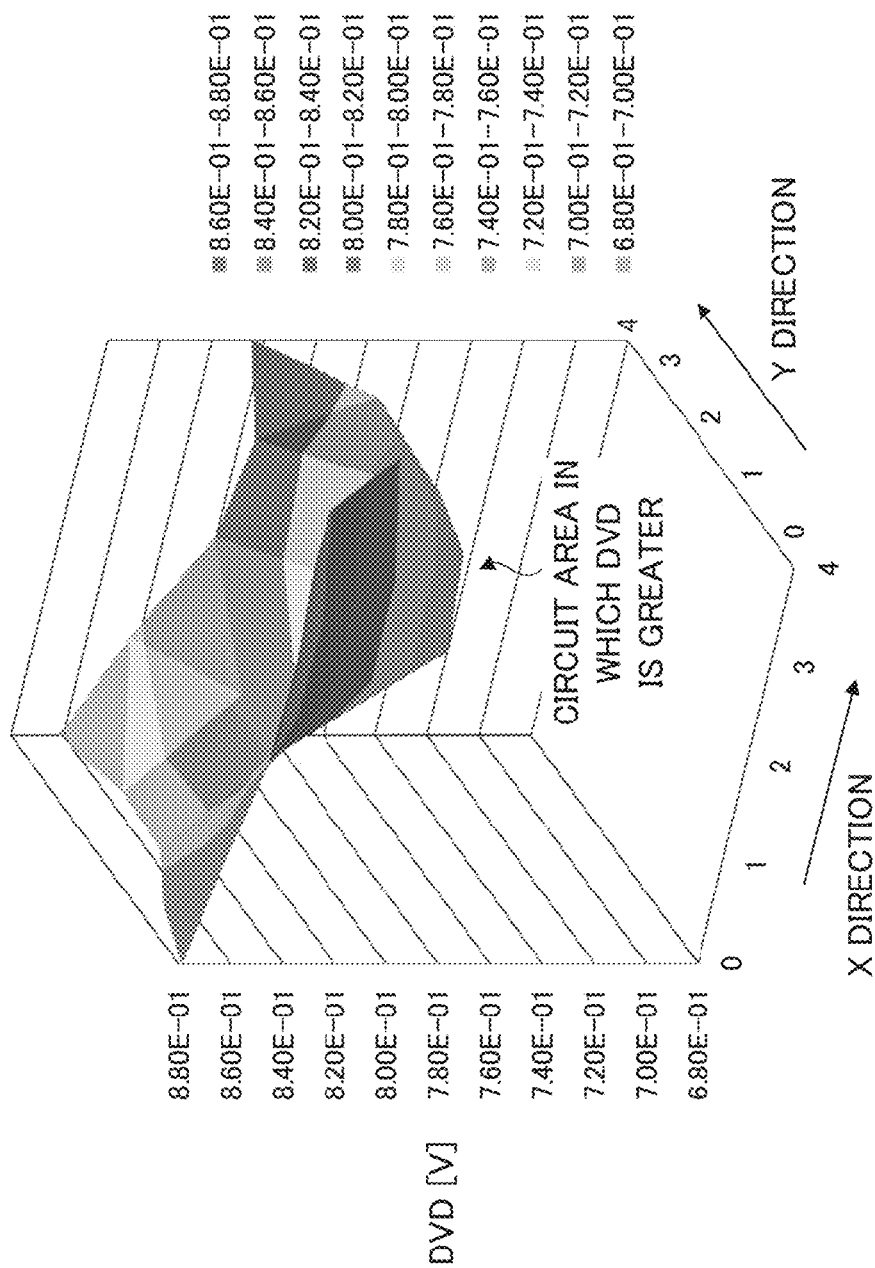
FIG. 11 is a three-dimensional graph illustrating a simulation result of dynamic voltage drop of the semiconductor device having the power supply conductive trace structure of FIG. 7.
Figure 12:
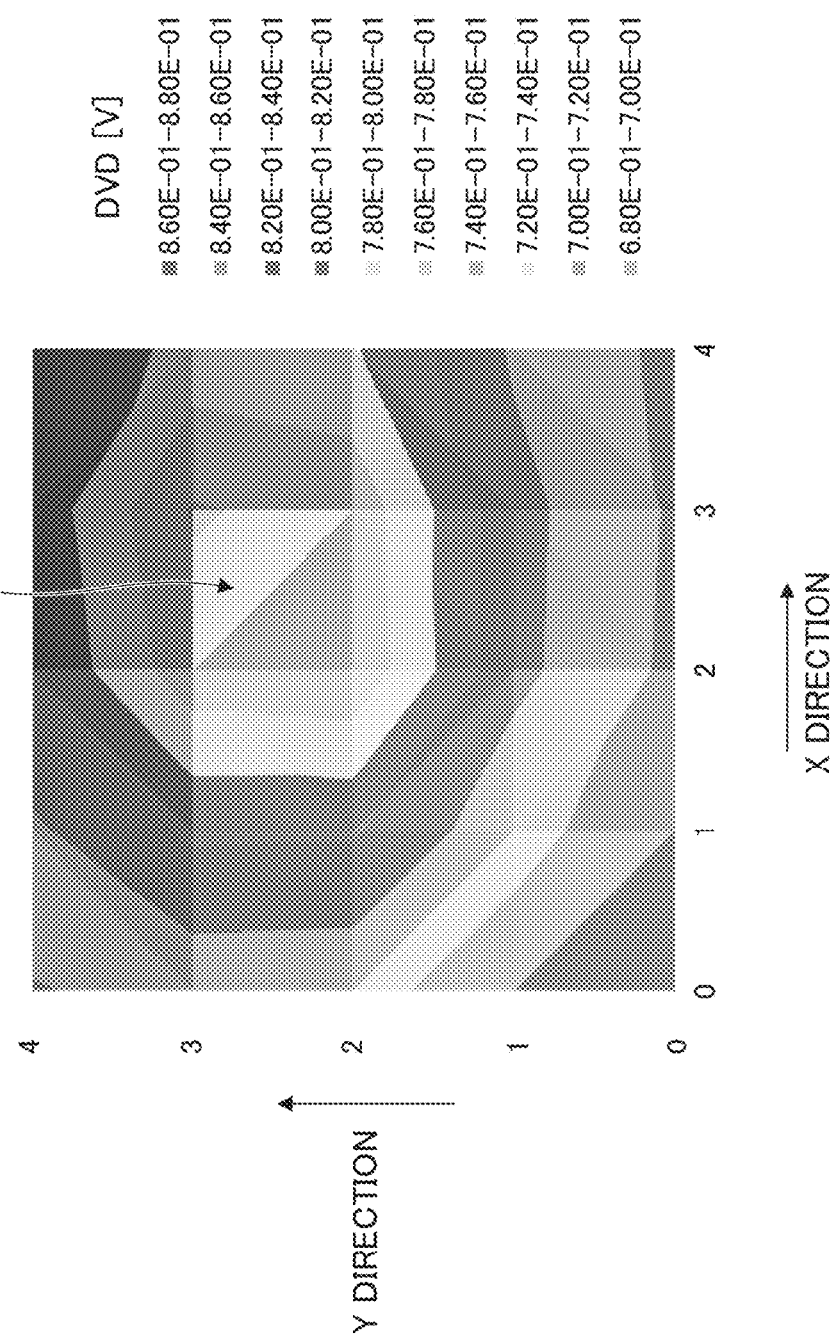
FIG. 12 is a two-dimensional graph illustrating a simulation result of dynamic voltage drop of the semiconductor device having the power supply conductive trace structure of FIG. 7.

FIG. 11 and FIG. 12 illustrate simulation results (a three-dimensional graph and a two-dimensional graph) of dynamic voltage drops of the semiconductor device 100S having the power supply conductive trace structure of FIG. 7. Similarly to FIG. 9 and FIG. 10, a rectangular area indicated in the X direction and the Y direction corresponds to the circuit area of the semiconductor device 100S. A circuit area in which a dynamic voltage drop DVD is relatively great substantially corresponds to a circuit area in which the load indicated in FIG. 9 and FIG. 10 is likely to rapidly change.

Figure 13:
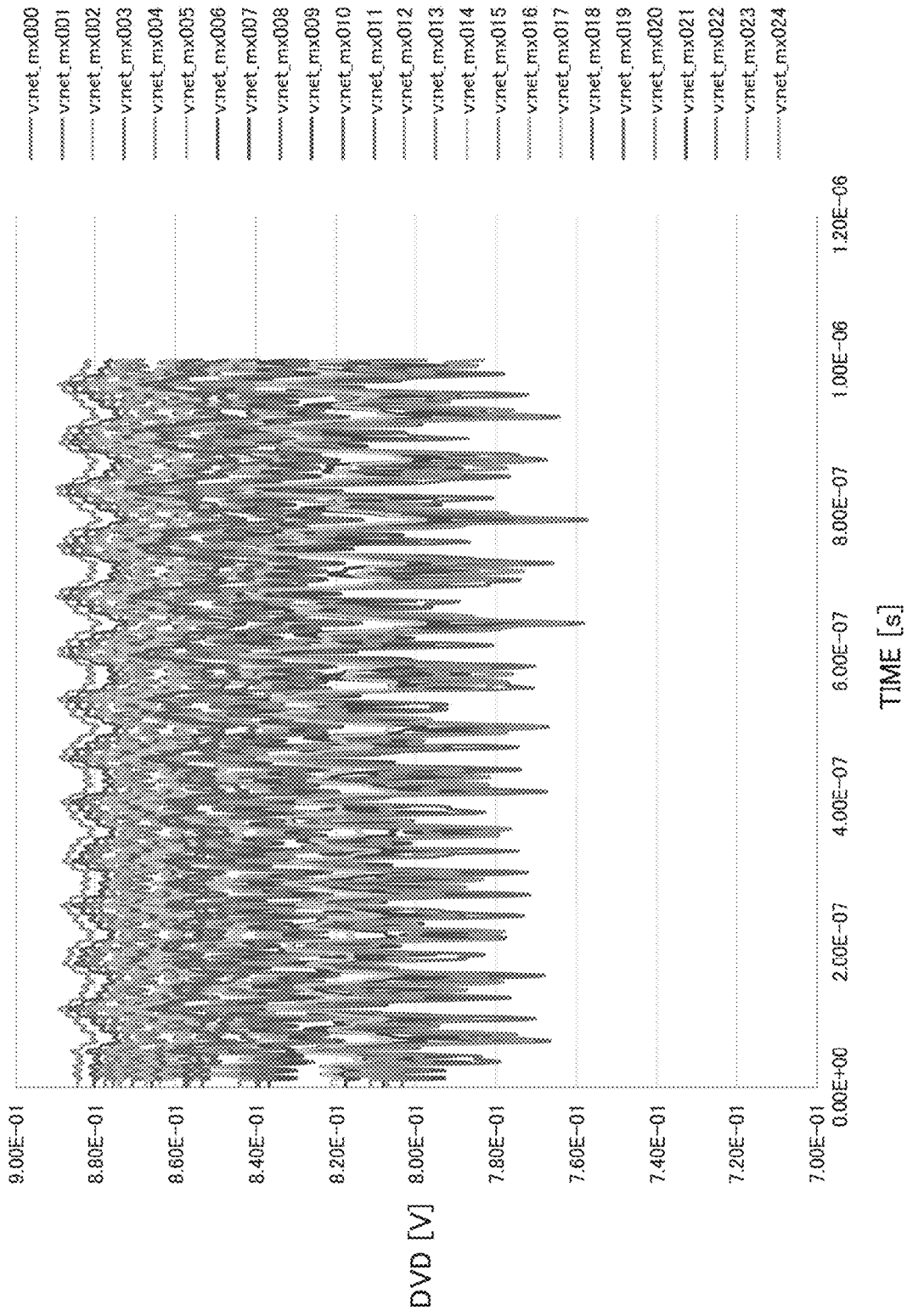
FIG. 13 is a waveform diagram illustrating a simulation result of temporal change of dynamic voltage drop of the semiconductor device having the power supply conductive trace structure of FIG. 7.

FIG. 13 illustrates a simulation result of a temporal change of the dynamic voltage drop in the semiconductor device 100S having the power supply conductive trace structure of FIG. 7. Symbols v:net in waveforms illustrated in FIG. 13 indicate positions different from each other in the area indicated in the X direction and the Y direction of FIG. 12.

Figure 14:
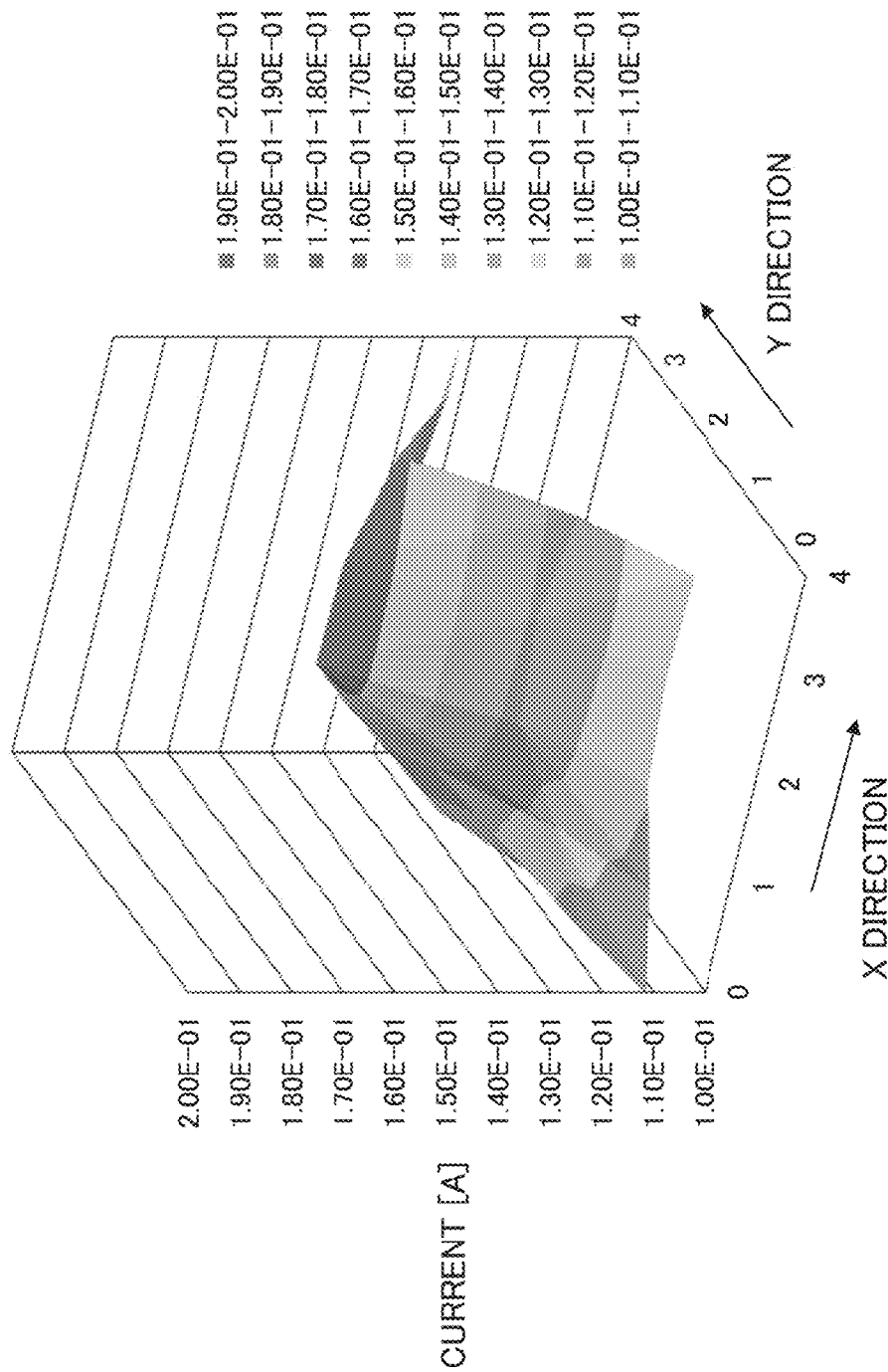
FIG. 14 is a three-dimensional graph illustrating a simulation result of load variation of the semiconductor device having the power supply conductive trace structure of FIG. 1.
Figure 15:
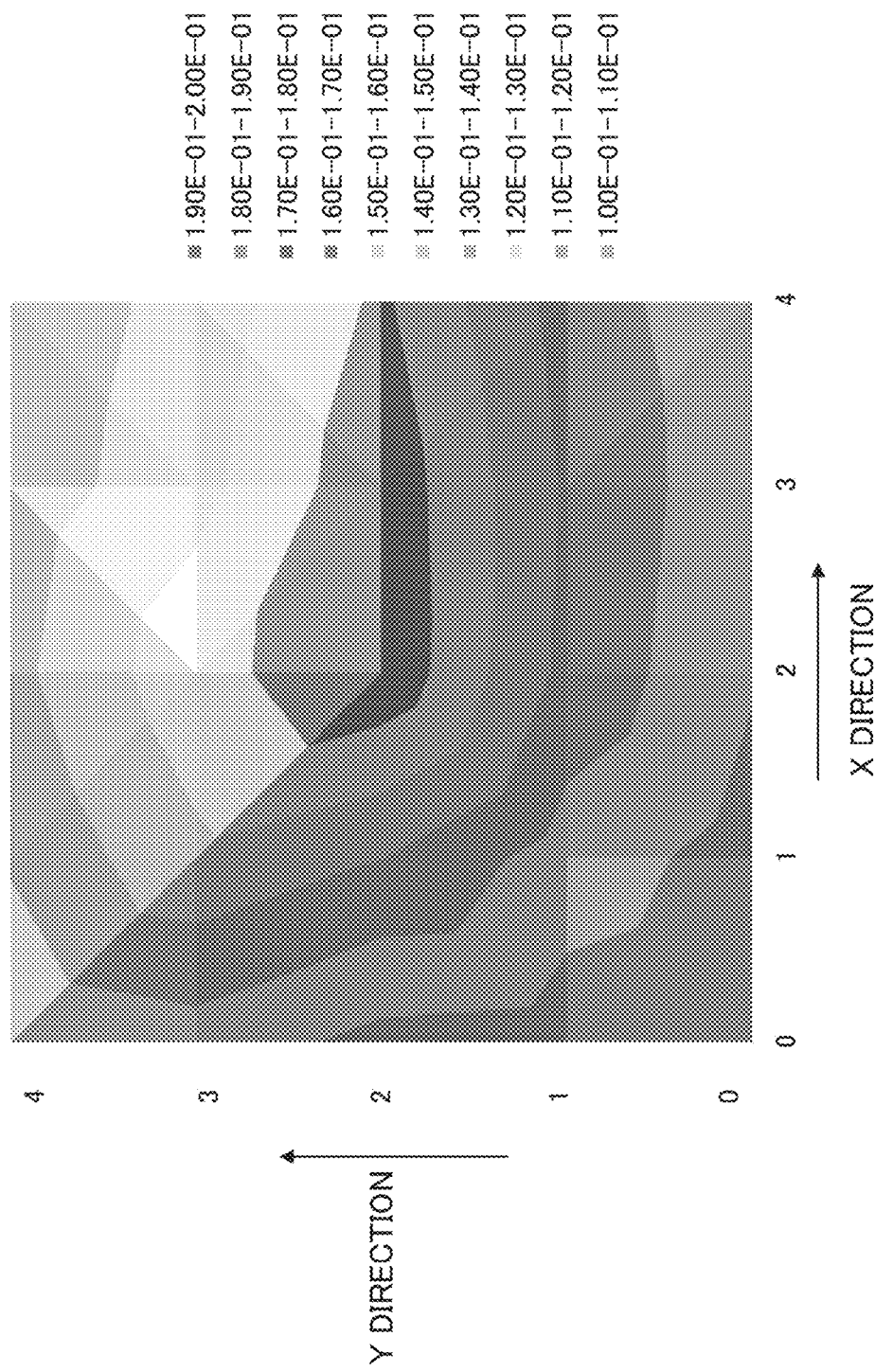
FIG. 15 is a two-dimensional graph illustrating a simulation result of load variation of the semiconductor device having the power supply conductive trace structure of FIG. 1.

FIG. 14 and FIG. 15 are simulation results (a three-dimensional graph and a two-dimensional graph) of load variations of the semiconductor device 100 having the power supply conductive trace structure of FIG. 1. FIG. 14 and FIG. 15 correspond to FIG. 9 and FIG. 10, respectively.

In this embodiment, as illustrated in FIG. 1 to FIG. 3, the power supply conductive trace RW is locally arranged in the redistribution layer RDL corresponding to the circuit area in which the dynamic voltage drop DVD is greater than others. Therefore, supply paths for supplying electric power supply currents to a circuit area in which the load is likely to rapidly change as illustrated in FIG. 9 and FIG. 10 can be increased. As a result, the electric power supply currents supplied to the circuit area in which the load is likely to rapidly change can be increased, and the rapid change in the load can be alleviated.

Figure 16:
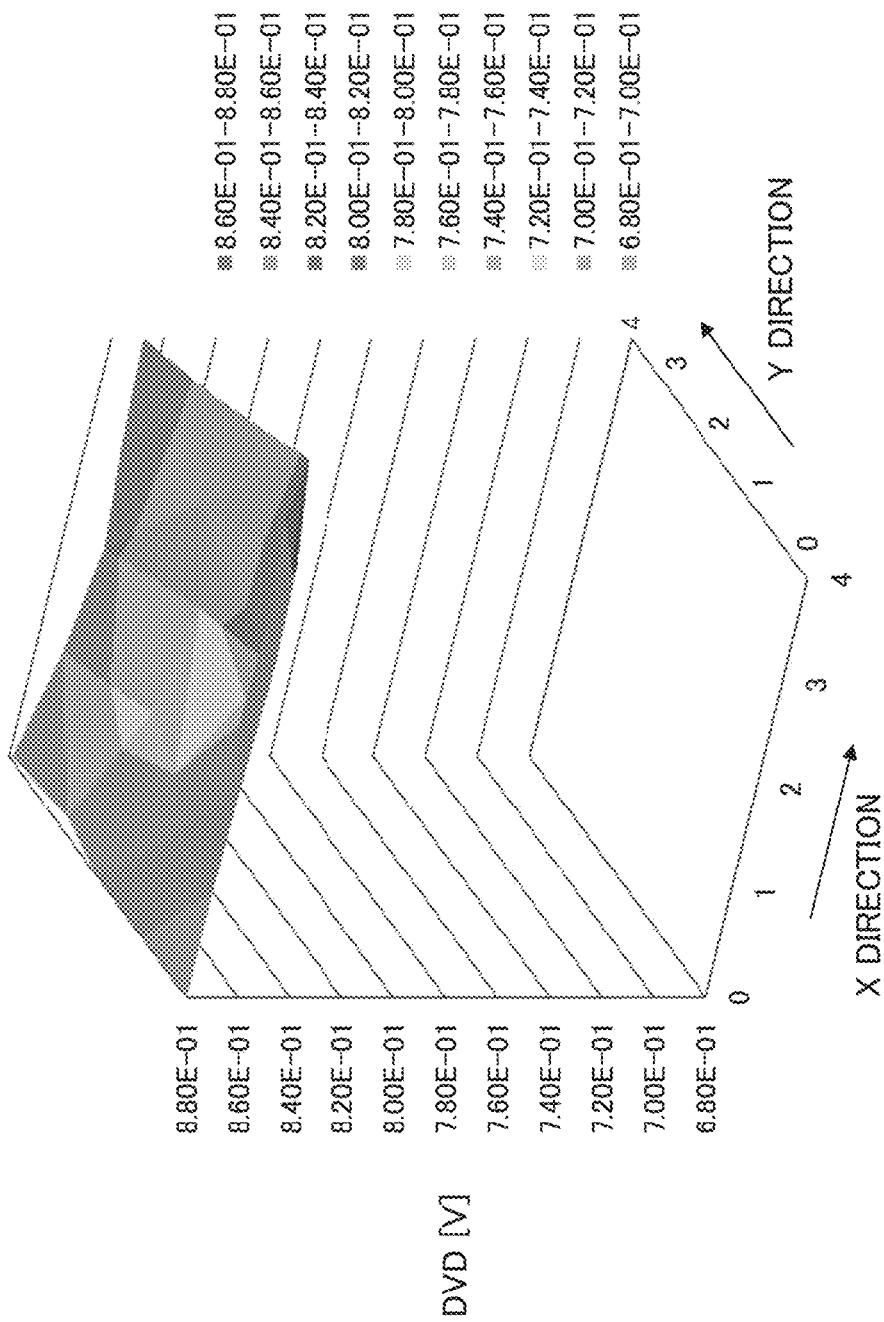
FIG. 16 is a three-dimensional graph illustrating a simulation result of dynamic voltage drop of the semiconductor device having the power supply conductive trace structure of FIG. 1.
Figure 17:
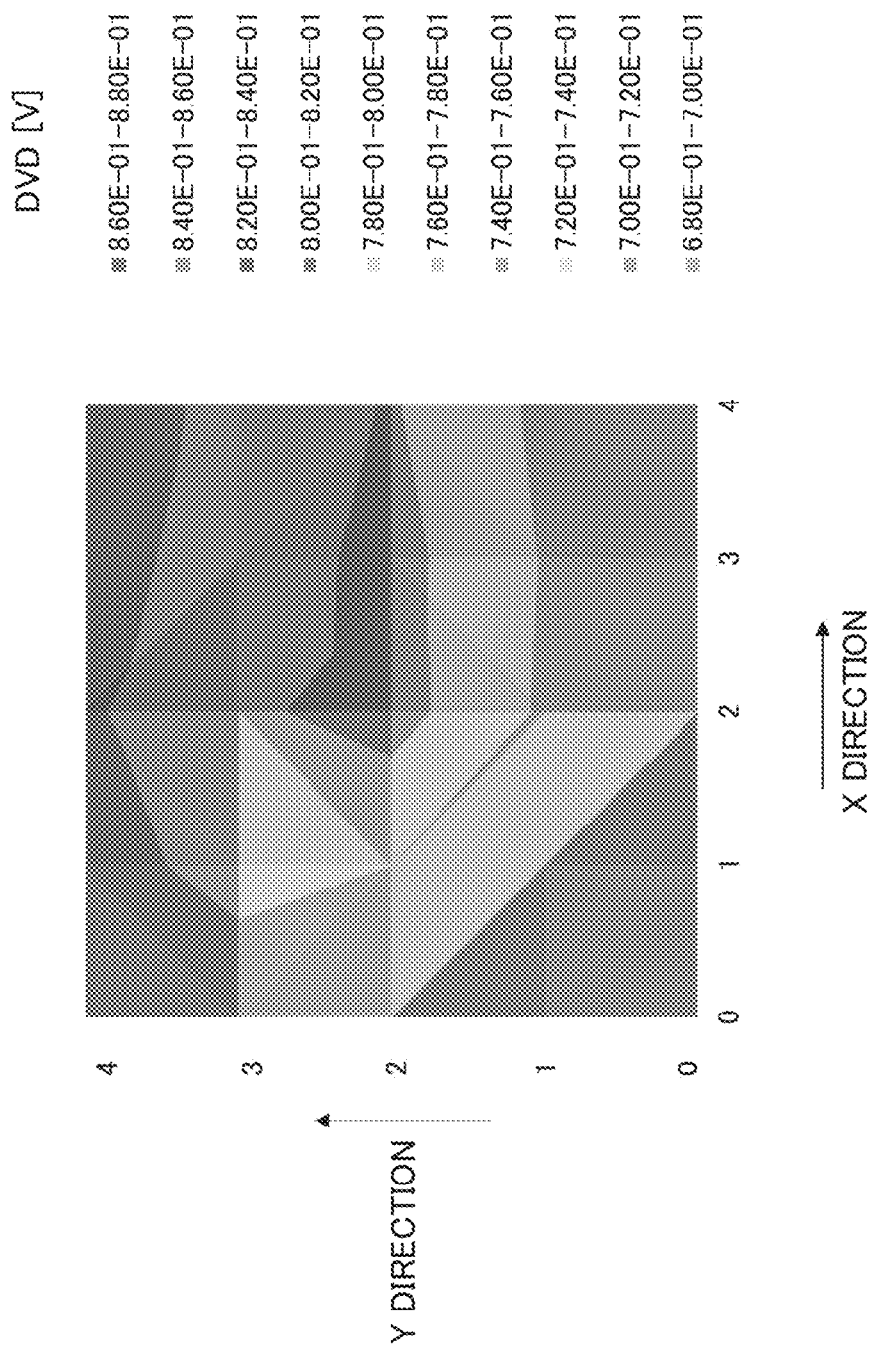
FIG. 17 is a two-dimensional graph illustrating a simulation result of dynamic voltage drop of the semiconductor device having the power supply conductive trace structure of FIG. 1.

FIG. 16 and FIG. 17 illustrate simulation results (a three-dimensional graph and a two-dimensional graph) of dynamic voltage drop of the semiconductor device 100 having the power supply conductive trace structure of FIG. 1. FIG. 16 and FIG. 17 correspond to FIG. 11 and FIG. 12, respectively.

It can be understood from FIG. 16 that the dynamic voltage drop DVD in the circuit area as illustrated in FIG. 11 and FIG. 12 is alleviated. Therefore, the shortage of the operating margin that has occurred in the semiconductor device 100S manufactured as a prototype can be solved in the semiconductor device 100. In other words, the dynamic voltage drop DVD can be alleviated by locally arranging the power supply conductive trace RW in the redistribution layer RDL, and the semiconductor device 100 having a desired operating margin can be manufactured.

Figure 18:
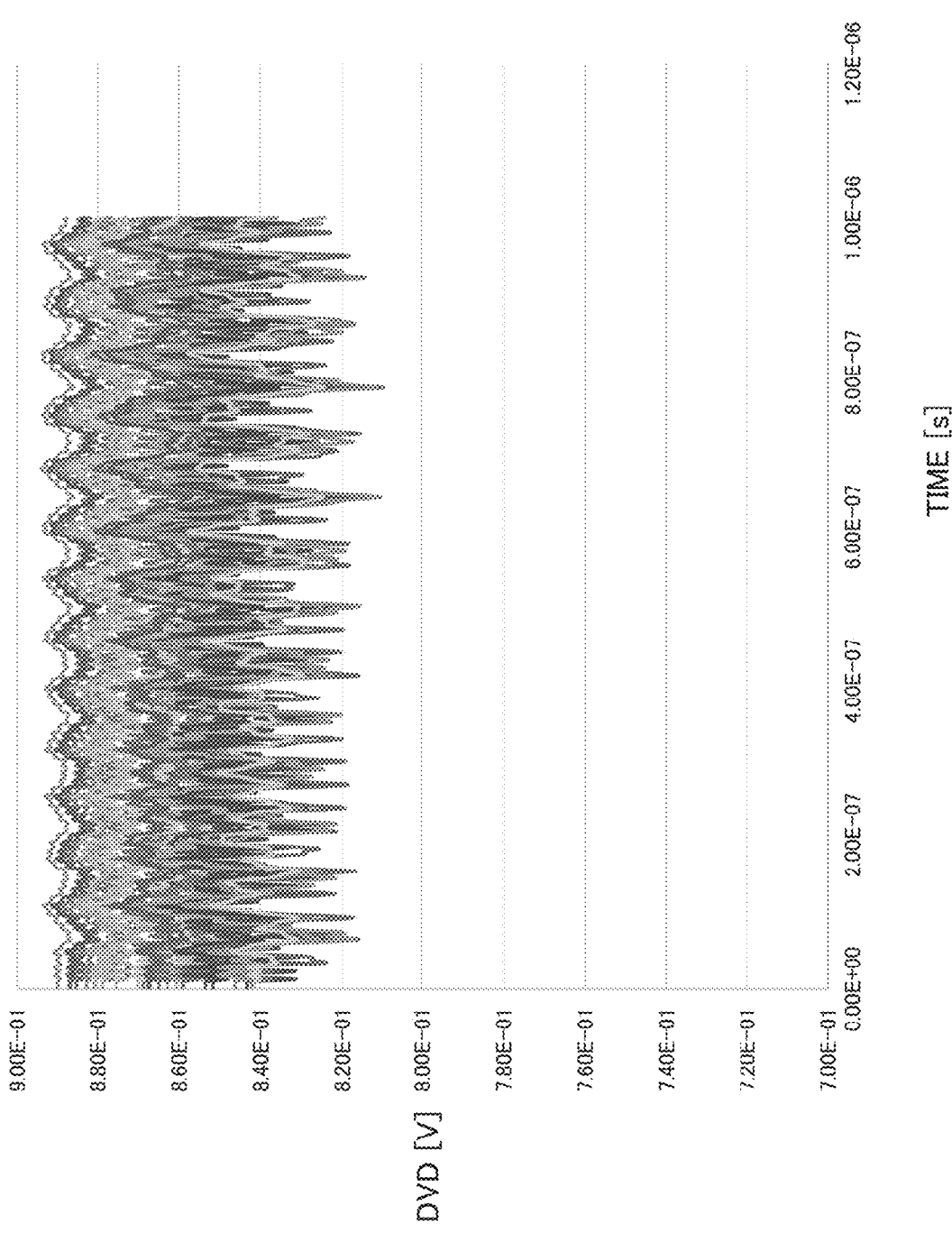
FIG. 18 is a waveform diagram illustrating a simulation result of temporal change of dynamic voltage drop of the semiconductor device having the power supply conductive trace structure of FIG. 1.

FIG. 18 illustrates a simulation result of a temporal change of the dynamic voltage drop in the semiconductor device 100 having the power supply conductive trace structure of FIG. 1. FIG. 18 corresponds to FIG. 13. It can be understood from FIG. 18 that, during operation of the semiconductor device 100, the dynamic voltage drop DVD is continuously alleviated.

Figure 19:
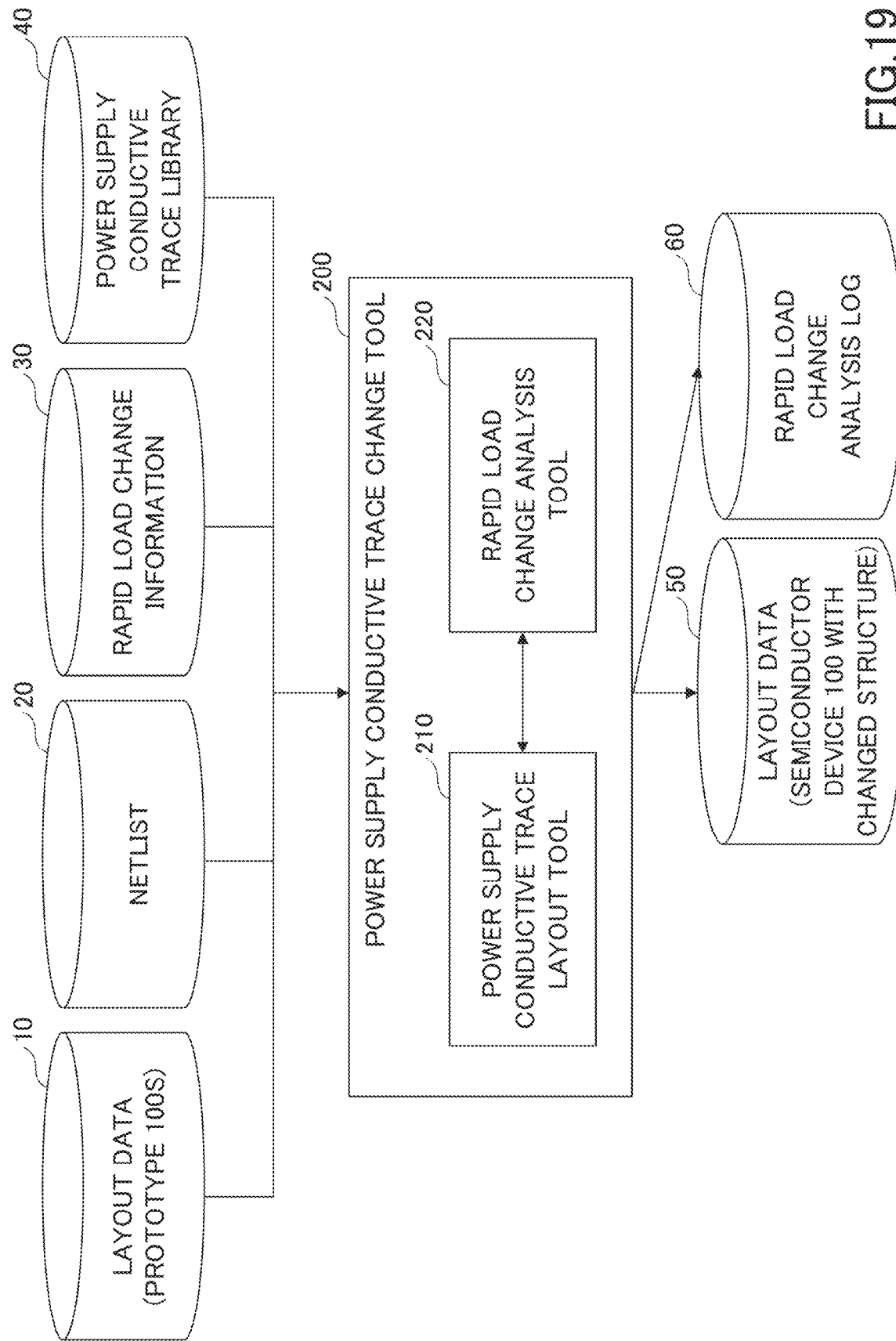
FIG. 19 is a block diagram illustrating an example of a layout design tool for designing the semiconductor device having the power supply conductive trace structure of FIG. 1.

FIG. 19 illustrates an example of a layout design tool for designing the semiconductor device 100 having the power supply conductive trace structure of FIG. 1. In FIG. 19, a power supply conductive trace change tool 200 for generating layout data of the semiconductor device 100 by redesigning the semiconductor device 100S that has been manufactured as a prototype is explained.

The power supply conductive trace change tool 200 includes a power supply conductive trace layout tool 210 and a rapid load change analysis tool 220. Layout data 10 of the semiconductor device 100S, i.e., the prototype, a netlist 20 of the semiconductor device 100S, 100, rapid load change information 30 of the semiconductor device 100S, and a power supply conductive trace library 40 are input to the power supply conductive trace layout tool 210. Then, the power supply conductive trace layout tool 210 changes the power supply conductive trace structure as illustrated in FIG. 7 to the power supply conductive trace structure as illustrated in FIG. 1.

The netlist 20 is circuit information, and is applicable to not only the semiconductor device 100S, i.e., the prototype, but also the semiconductor device 100 that has the changed power supply conductive trace structure. The rapid load change information includes simulation results illustrated in FIG. 9 to FIG. 13. The power supply conductive trace library 40 includes, as libraries, information about the power supply conductive trace RW to be arranged in the redistribution layer RDL and information about the vias VIA connecting the power supply conductive trace RW to the power supply conductive trace PW7.

The rapid load change analysis tool 220 analyzes rapid load variation of the power supply conductive trace network including the power supply conductive trace RW, and outputs simulation results and the like illustrated in FIG. 14 to FIG. 18. The power supply conductive trace change tool 200 repeats revision of the power supply conductive trace RW with the power supply conductive trace layout tool 210 and analysis with the rapid load change analysis tool 220 until the dynamic voltage drop DVD becomes equal to or less than a predetermined level on the basis of simulation results of the rapid load change analysis tool 220.

Then, the power supply conductive trace change tool 200 outputs layout data 50 of the semiconductor device 100 obtained by changing the power supply conductive trace structure of the semiconductor device 100S and a rapid load change analysis log 60, i.e., an analysis result that is output by the rapid load change analysis tool 220.

Figure 20:
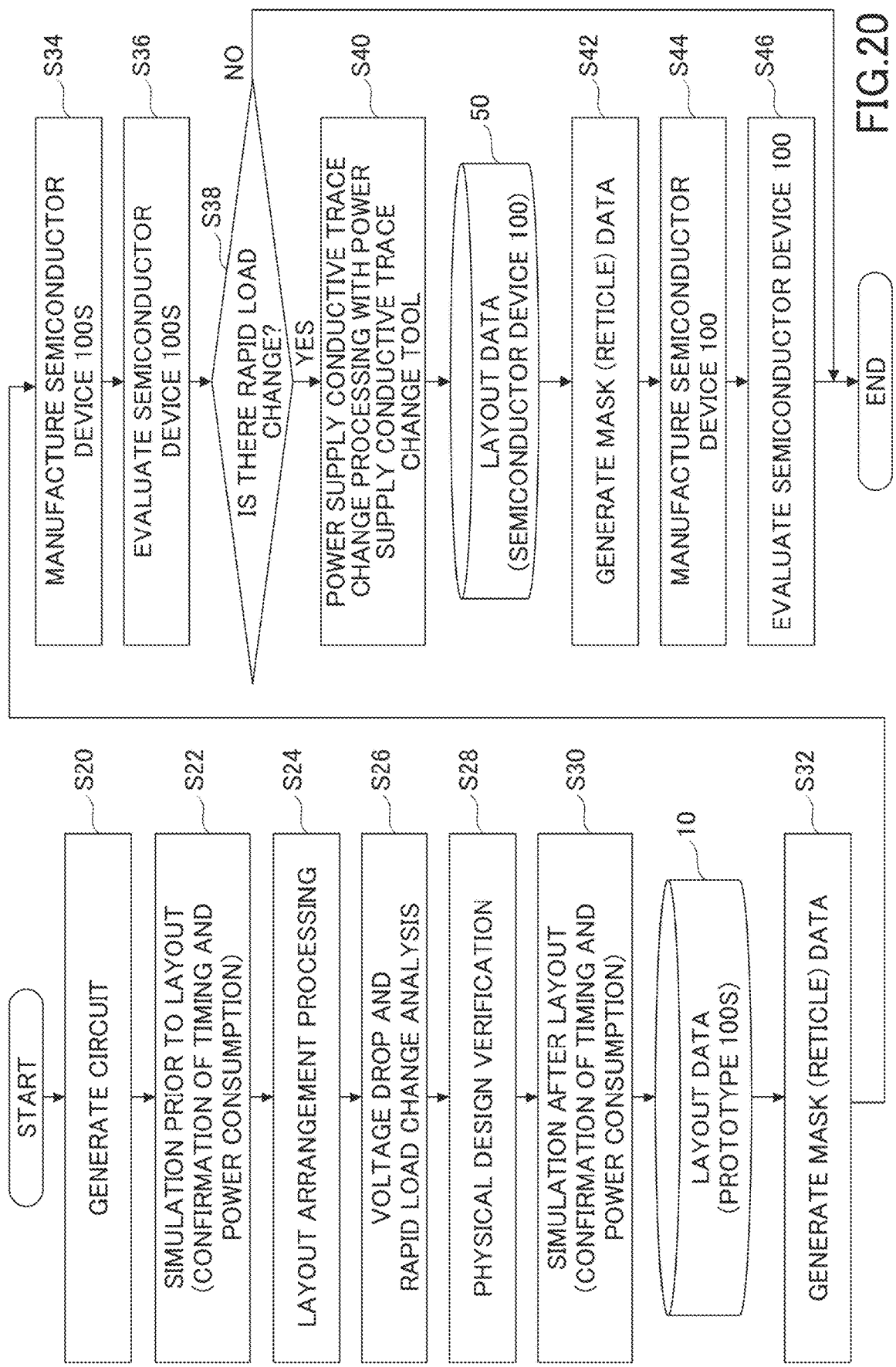
FIG. 20 is a processing flow diagram illustrating an example of a flow of design of the semiconductor device having the power supply conductive trace structure of FIG. 1.

FIG. 20 illustrates an example of a flow for designing the semiconductor device 100 having the power supply conductive trace structure of FIG. 1. FIG. 20 illustrates an example of a power supply conductive trace layout method of the semiconductor device 100. First, in step S20, logic design and circuit design of the semiconductor device 100 are performed. Subsequently, in step S22, before the layout design of the semiconductor device 100 is performed, the logic simulation and the circuit simulation are performed to confirm the operation timing, power consumption, and the like of the circuit.

Subsequently, in step S24, arrangement processing for designing the layout of transistors, conductive traces, and the like of the semiconductor device 100 is performed. Subsequently, in step S26, simulation of the voltage drop of the power supply voltage VDD and rapid load change analysis are performed. Subsequently, in step S28, physical design verification is performed to determine whether the arrangement processing performed in step S24 satisfies a layout rule.

Subsequently, in step S30, after the layout design of the semiconductor device 100, a simulation in view of conductive trace loads and the like based on the layout is performed to confirm the operation timing, power consumption, and the like of the circuit. Then, the layout data 10 (FIG. 19) of the semiconductor device 100S manufactured as a prototype for the semiconductor device 100 is generated.

Subsequently, in step S32, mask data (reticle data) of each layout layer of the (prototype) semiconductor device 100S is generated. Subsequently, in step S34, the (prototype) semiconductor device 100S is manufactured by using the generated photomasks (reticles). Subsequently, in step S36, an operation test of the (prototype) semiconductor device 100S that has been manufactured is performed to evaluate the electric characteristics (i.e., determine whether there is an operation failure).

Subsequently, in step S38, when it is determined that there is a rapid load variation (an occurrence of an operation failure) in the evaluation of the electric characteristics, step S40 is performed. For example, in a case where the graphs illustrated in FIG. 9 to FIG. 13 are obtained in the simulation performed in step S36, it may be determined that there is a rapid load variation. Conversely, in a case where it is determined that there is not any rapid load variation, it is determined to manufacture mass-production version by using the photomasks (reticles) of the (prototype) semiconductor device 100S, and the processing illustrated in FIG. 20 is ended.

In step S40, power supply conductive trace change processing is performed by using the power supply conductive trace change tool 200 of FIG. 19. In step S40, the power supply conductive trace structure of the (prototype) semiconductor device 100S illustrated in FIG. 7 is changed to the power supply conductive trace structure of the semiconductor device 100 illustrated in FIG. 1. Then, the layout data 50 (FIG. 19) of the semiconductor device 100 having the power supply conductive trace structure of FIG. 1 is generated. An example of power supply conductive trace change processing performed in step S40 is explained with reference to FIG. 21.

Subsequently, in step S42, the mask data (reticle data) in each layer of the semiconductor device 100 is generated. Subsequently, in step S44, the semiconductor device 100 is manufactured by using the generated photomasks (reticles).

Subsequently, in step S46, evaluation of the electric characteristics of the semiconductor device 100 that has been manufactured is performed, and the processing illustrated in FIG. 20 is ended.

Figure 21:
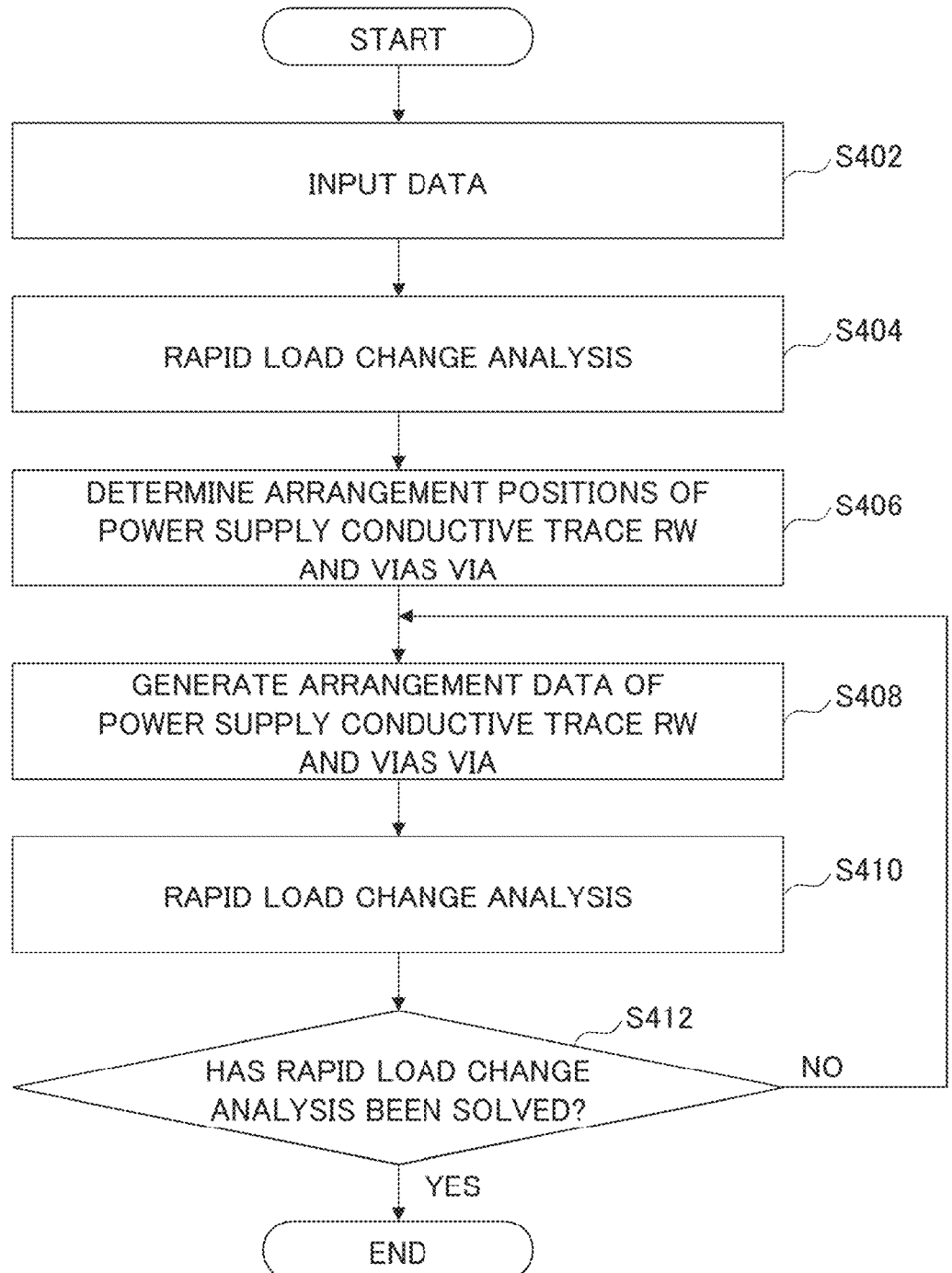
FIG. 21 is a processing flow diagram illustrating an example of an operation of step S40 of FIG. 20.

FIG. 21 illustrates an example of an operation of step S40 of FIG. 20. First, in step S402, data such as the layout data 10, the netlist 20, and the rapid load change information and the like of the (prototype) semiconductor device 100S illustrated in FIG. 19 are input to the power supply conductive trace change tool 200. Subsequently, in step S404, the rapid load change analysis tool 220 performs the rapid load change analysis explained with reference to FIG. 9 to FIG. 13. In a case where the rapid load change analysis explained with reference to FIG. 9 to FIG. 13 is performed in step S36 of FIG. 20, step S404 may be omitted.

Subsequently, in step S406, the power supply conductive trace change tool 200 determines the arrangement positions of the power supply conductive trace RW of the redistribution layer RDL and the vias VIA in the insulating layer IL7 on the basis of a result of the rapid load change analysis in step S404. For example, the power supply conductive trace change tool 200 determines to arrange the power supply conductive trace RW and the vias VIA in an area in which the load is likely to rapidly change as illustrated in FIG. 9 and FIG. 10 (i.e., the conductive trace area A1 of FIG. 1). Alternatively, the power supply conductive trace change tool 200 determines to arrange the power supply conductive trace RW and the vias VIA in an area in which the dynamic voltage drop DVD is likely to occur as illustrated in FIG. 11 and FIG. 12 (i.e., the conductive trace area A1 of FIG. 1).

Subsequently, in step S408, the power supply conductive trace layout tool 210 generates arrangement data of the power supply conductive trace RW and the vias VIA according to the arrangement positions determined in step S406. The arrangement data generated in step S408 includes data of only the redistribution layer RDL and the insulating layer IL7, and data of the layers from the power supply conductive trace layer PL towards the semiconductor circuit board is not changed. For this reason, the photomasks used for the prototype of the semiconductor device 100S can be used for manufacturing the semiconductor device 100 without any change.

Subsequently, in step S410, the rapid load change analysis tool 220 performs the rapid load change analysis on the power supply conductive trace structure including the power supply conductive trace RW and the vias VIA that have been added in step S408. Subsequently, in step S412, in a case where it was determined in step S38 of FIG. 20 that there was a rapid load variation but the rapid load variation has been solved, the power supply conductive trace change tool 200 ends the processing illustrated in FIG. 21. In a case where the rapid load variation has not been solved, the power supply conductive trace change tool 200 repeats the processing in steps S408, S410 until the rapid load variation is solved. For example, in a case where the graphs as illustrated in FIG. 14 to FIG. 18 have been obtained in the simulation performed in step S410, the rapid load change analysis tool 220 determines that the rapid load variation has been solved.

Hereinabove, in this embodiment, the semiconductor device 100 is manufactured by locally arranging the power supply conductive trace RW in the redistribution layer RDL on the basis of evaluations of electric characteristics of the semiconductor device 100S that has been manufactured as a prototype. Therefore, the dynamic voltage drop that occurs locally can be alleviated, and the semiconductor device 100 can be manufactured with a desired operating margin.

Also, the operating margin of the semiconductor device 100 can be improved without changing the layout of the power supply conductive traces PW and the transistors. Therefore, the number of photomasks (reticles) to be changed or the number of photomasks (reticles) to be newly generated can be minimized. Further, it is not necessary to change the chip size of the semiconductor device 100, the positions of the pads PAD, and the number of pads PAD. This can eliminate the necessity to change the BGA package PKG, and also, can eliminate the necessity to change the circuit board on which the BGA package PKG is mounted. As a result, the dynamic voltage drop can be alleviated by reducing the cost in redesigning the semiconductor device 100.

Also, the redistribution layer RDL and the insulating layer IL7 are added only in a case where a dynamic voltage drop greater than expected occurs in the semiconductor device 100S that has been manufactured as a prototype. Therefore, useless layout layers are less likely to be added, and the cost of the semiconductor device 100 can be minimized.

Second Embodiment

Figure 22:
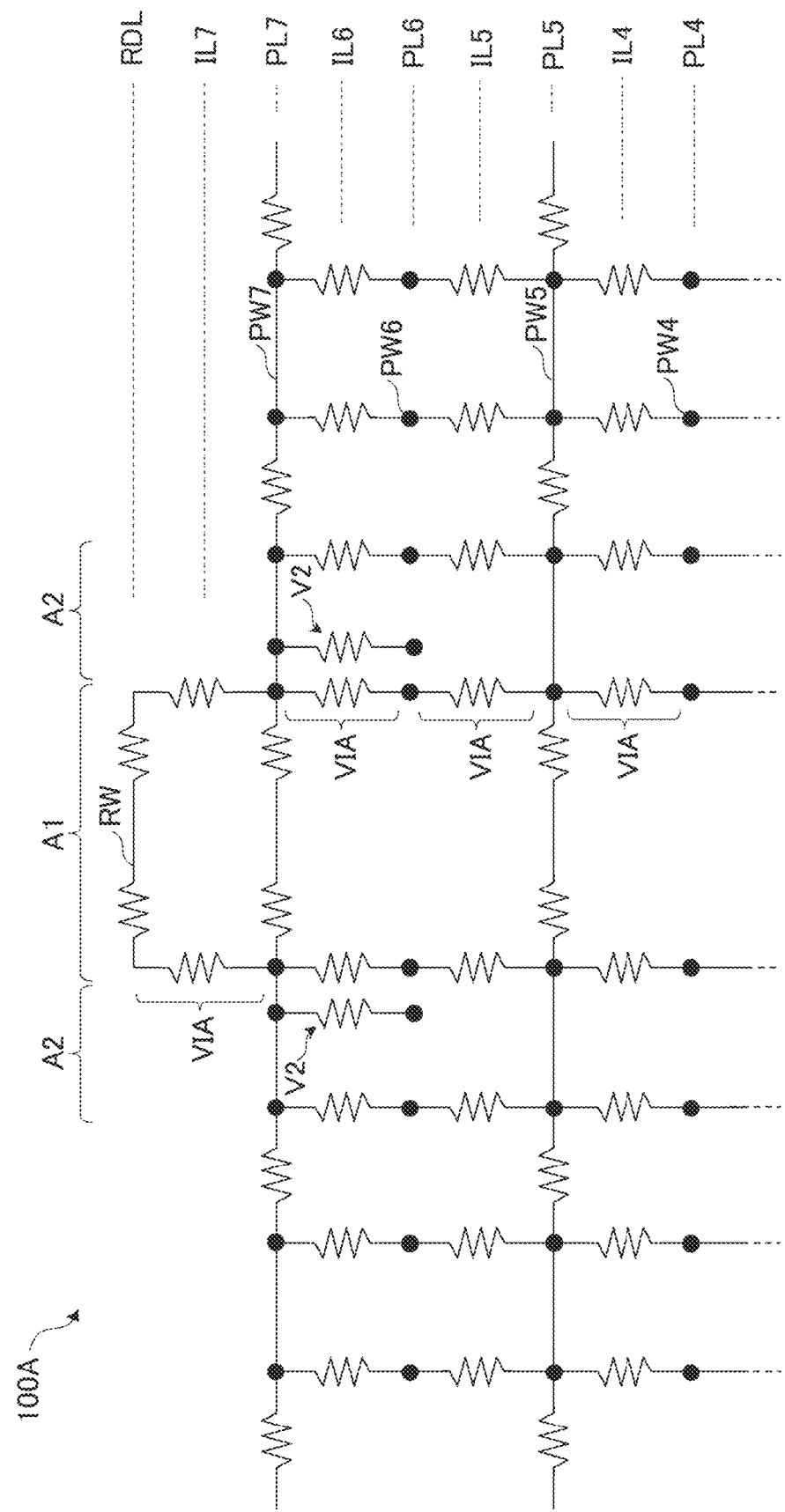
FIG. 22 is a schematic view illustrating an example of a power supply conductive trace structure of a semiconductor device according to a second embodiment.

FIG. 22 illustrates an example of the power supply conductive trace structure of a semiconductor device 100A according to the second embodiment. Constituent elements similar to FIG. 1 are denoted with the same reference numerals, and detailed description thereabout is omitted. The semiconductor device 100A illustrated in FIG. 22 has a power supply conductive trace structure similar to the power supply conductive trace structure of FIG. 1 except that the semiconductor device 100A includes vias V2 connecting the power supply conductive trace layers PL7, PL6 in a conductive trace area A2 around the conductive trace area A1. For example, the conductive trace area A2 is provided in a band shape around the conductive trace area A1. For example, the conductive trace area A1 corresponds to a circuit area in which the dynamic voltage drop DVD is relatively great in FIG. 12, and the conductive trace area A2 corresponds to a white area around the circuit area in which the dynamic voltage drop DVD is relatively great in FIG. 12. The conductive trace area A2 is an example of a first area.

In the semiconductor device 100A illustrated in FIG. 22, the density of the vias VIA provided, between the power supply conductive trace layers PL7 and PL6, in the conductive trace area A2 located around the conductive trace area A1 is configured to be higher than the density of the vias VIA provided in areas other than the conductive trace area A2. The flow of design of the semiconductor device 100A illustrated in FIG. 22 and the power supply conductive trace change tool 200 used for the power supply conductive trace change processing are similar to FIG. 19 to FIG. 21. However, in step S406 of FIG. 21, it is determined that the vias VIA are arranged not only in the conductive trace area A1 but also the conductive trace area A2, and data of the power supply conductive trace layer PL7 and the insulating layer IL6 are additionally generated in the arrangement data generated in step S408.

Supply paths for supplying electric power supply currents to a circuit corresponding to a location in which a dynamic voltage drop greater than expected occurs can be increased by locally increasing the number of vias VIA. As a result, the amount of electric power supply current supplied to the circuit corresponding to the location in which the dynamic voltage drop greater than expected occurs can be increased, and the dynamic voltage drop that occurs locally can be alleviated.

In this embodiment, the dynamic voltage drop that occurs locally can be alleviated by adding photomasks for the redistribution layer RDL and the insulating layer IL7 and changing the photomasks for the power supply conductive trace layer PL7 and the insulating layer IL6. More vias VIA can be arranged in the insulating layer IL6 by providing the conductive trace area A2 in a band shape around the conductive trace area A1. Accordingly, the amount of electric power supply current supplied to the circuit corresponding to the location in which the dynamic voltage drop greater than expected occurs can be further increased, and the dynamic voltage drop can be further alleviated.

Third Embodiment

Figure 23:
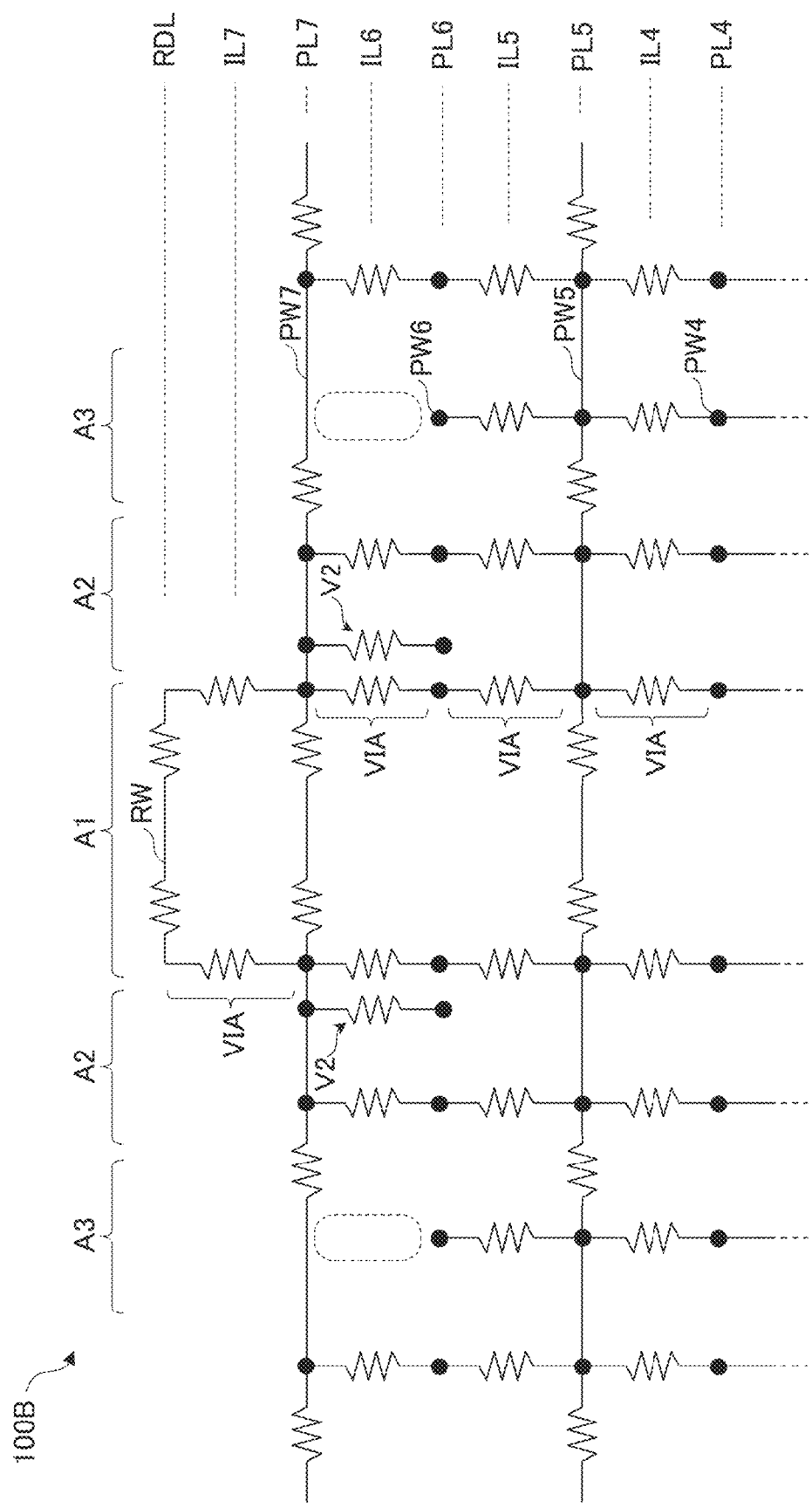
FIG. 23 is a schematic view illustrating an example of a power supply conductive trace structure of a semiconductor device according to a third embodiment.

FIG. 23 illustrates an example of a power supply conductive trace structure of a semiconductor device 100B according to the third embodiment. Constituent elements similar to FIG. 1 are denoted with the same reference numerals, and detailed description thereabout is omitted. The semiconductor device 100B illustrated in FIG. 23 has a power supply conductive trace structure similar to the power supply conductive trace structure of FIG. 22 except that the semiconductor device 100B does not include the vias (indicated by ellipses of broken lines) connecting the power supply conductive trace layers PL7 and PL6, which are arranged in a conductive trace area A3 around the conductive trace area A2. For example, the conductive trace area A3 is arranged in a band shape around the conductive trace area A2. For example, the conductive trace area A3 corresponds to a black area outside of the white area (the conductive trace area A2) around the circuit area in which the greater dynamic voltage drop DVD is greater in FIG. 12. The conductive trace area A3 is an example of a second area.

In the semiconductor device 100B as illustrated in FIG. 23, the density of the vias VIA provided, between the power supply conductive trace layers PL7 and PL6, in the conductive trace area A3 located around the conductive trace area A2 is configured to be lower than the density of the vias VIA provided in areas other than the conductive trace area A3. The flow of design of the semiconductor device 100B illustrated in FIG. 23 and the power supply conductive trace change tool 200 used for the power supply conductive trace change processing are similar to FIG. 19 to FIG. 21. However, in step S406 of FIG. 21, it is determined not only that the vias VIA are arranged in the conductive trace areas A1, A2 but also that the vias VIA are removed from the conductive trace area A3, and data of the power supply conductive trace layer PL7 and the insulating layer IL6 are additionally generated in the arrangement data generated in step S408.

For example, the conductive trace area A3 is an area in which the occurrence of the dynamic voltage drop is within an expected level, and it is confirmed by the rapid load change analysis performed in step S410 of FIG. 21 that the occurrence of the dynamic voltage drop in the conductive trace area A3 is within the expected level even after the number of vias VIA is reduced.

The conductive trace area A3 in which the number of vias VIA is reduced is provided around the conductive trace area A2 in which the number of vias VIA is locally increased, so that the resistance of the vias VIA arranged in parallel in the conductive trace areas A1, A2 is reduced, and the resistance of the vias VIA arranged in parallel in the conductive trace area A3 can be increased. Therefore, the electric power supply current flowing to the vias VIA arranged in the conductive trace areas A1, A2 can be relatively increased. As a result, the amount of electric power supply current supplied to the circuit corresponding to the location in which the dynamic voltage drop greater than expected occurs can be further increased, and the dynamic voltage drop can be further alleviated.

In this embodiment, the dynamic voltage drop that occurs locally can be alleviated by adding photomasks for the redistribution layer RDL and the insulating layer IL7 and changing photomasks for the power supply conductive trace layer PL7 and the insulating layer IL6.

A greater number of vias VIA can be removed from the conductive trace area A3 by arranging the conductive trace area A3 in a band shape around the conductive trace area A2. Therefore, the resistance of the vias VIA arranged in parallel in the conductive trace area A3 can be further increased, and the amount of electric power supply current flowing to the vias VIA arranged in the conductive trace areas A1, A2 can be further increased. Accordingly, the amount of electric power supply current supplied to the circuit corresponding to the location in which the dynamic voltage drop greater than expected occurs can be further increased, and the dynamic voltage drop can be further alleviated.

Figure 24:
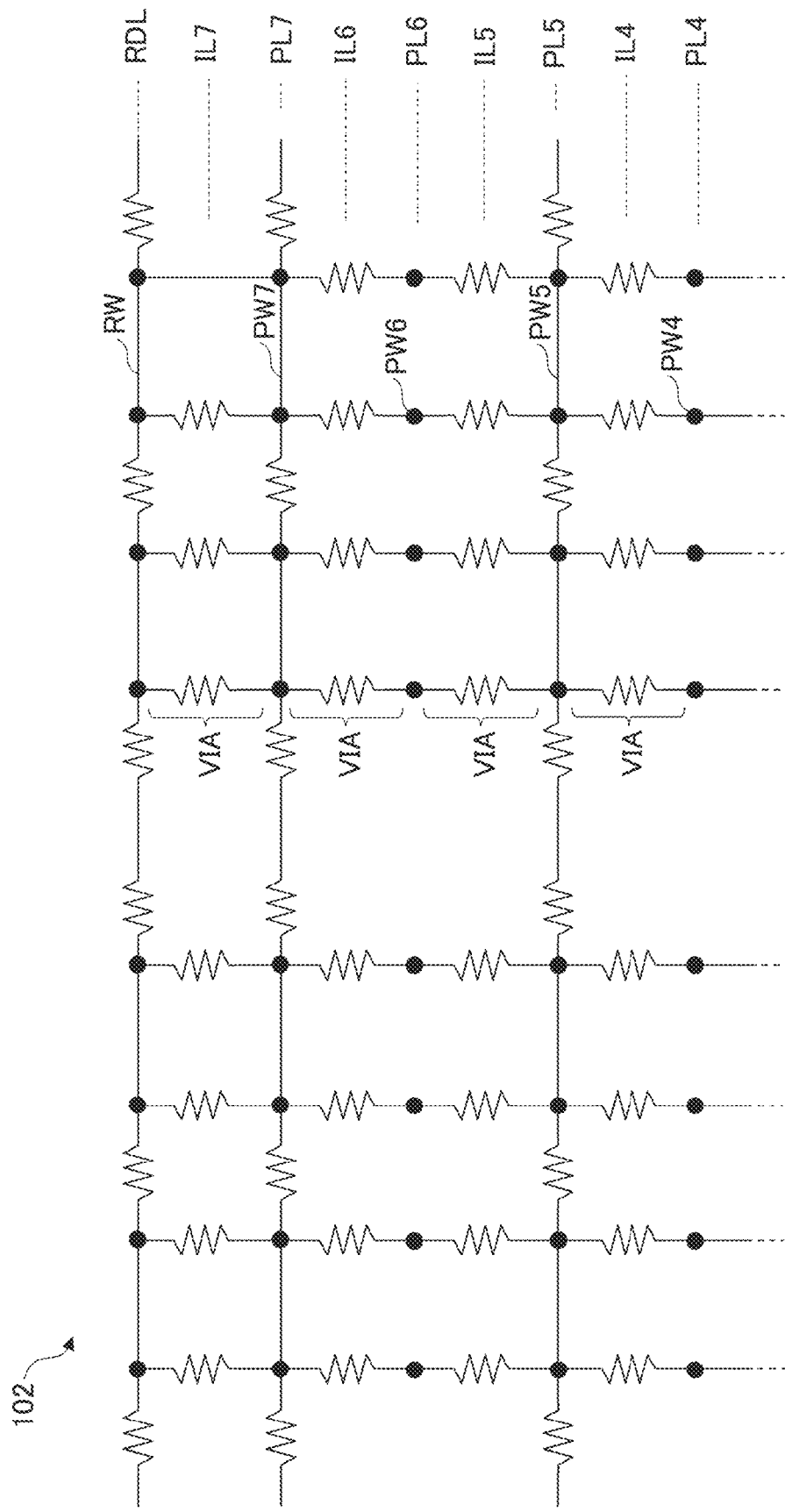
FIG. 24 is a schematic view illustrating an example (Comparative Example) of a power supply conductive trace structure of another semiconductor device.

FIG. 24 illustrates an example (comparative example) of a power supply conductive trace structure of another semiconductor device 102. In the semiconductor device 102 illustrated in FIG. 24, the power supply conductive trace RW is arranged on the entire surface of the redistribution layer RDL. The power supply conductive traces RW and PL7 are connected with each other through the vias VIA arranged at the same density as the density of the vias VIA connecting the power supply conductive trace layers PL7 and PL6. The power supply conductive trace structure of the semiconductor device 102 closer to the semiconductor circuit board than is the power supply conductive trace layer PL7 is similar to FIG. 1.

Figure 25:
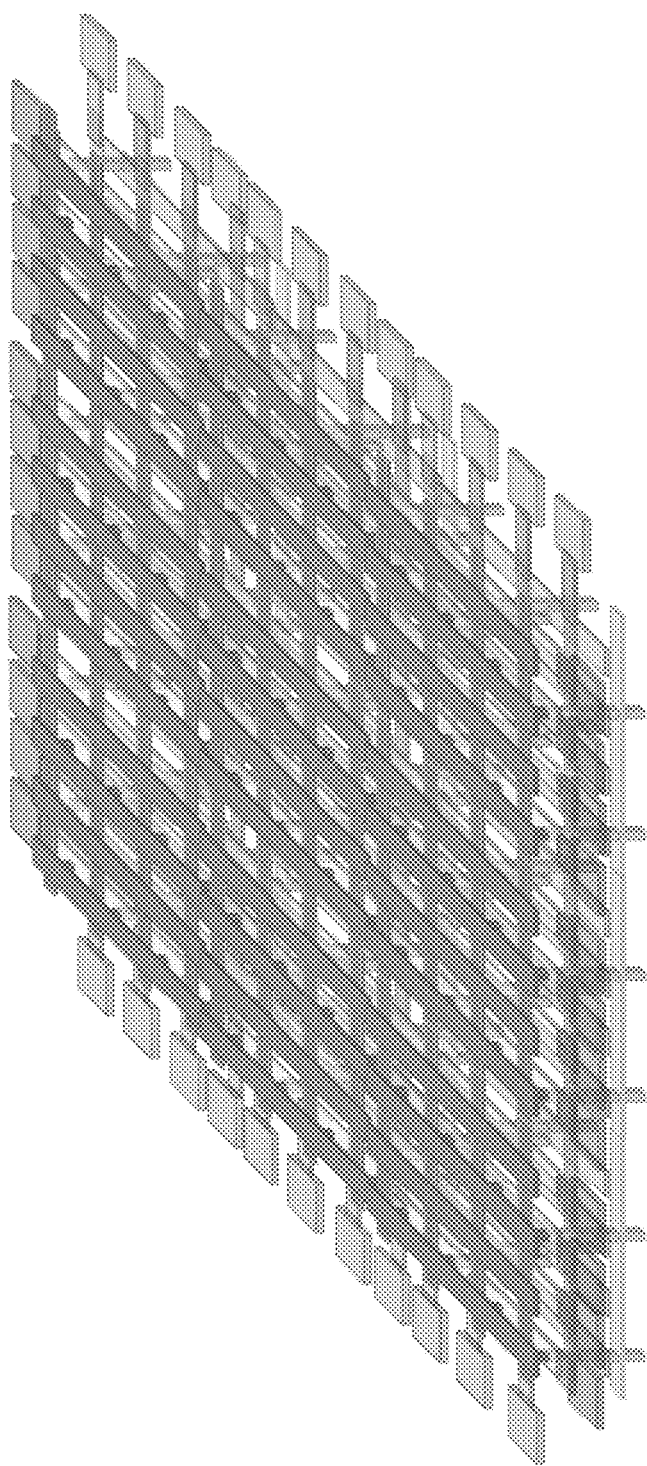
FIG. 25 is a partial perspective view illustrating an example of a power supply conductive trace layout of the semiconductor device having the power supply conductive trace structure of FIG. 24.

FIG. 25 is a partial perspective view illustrating an example of a power supply conductive trace layout of the semiconductor device 102 having the power supply conductive trace structure of FIG. 24. FIG. 25 is similar to FIG. 1 except that the power supply conductive trace RW is arranged on the entire surface of the semiconductor device 102.

Figure 26:
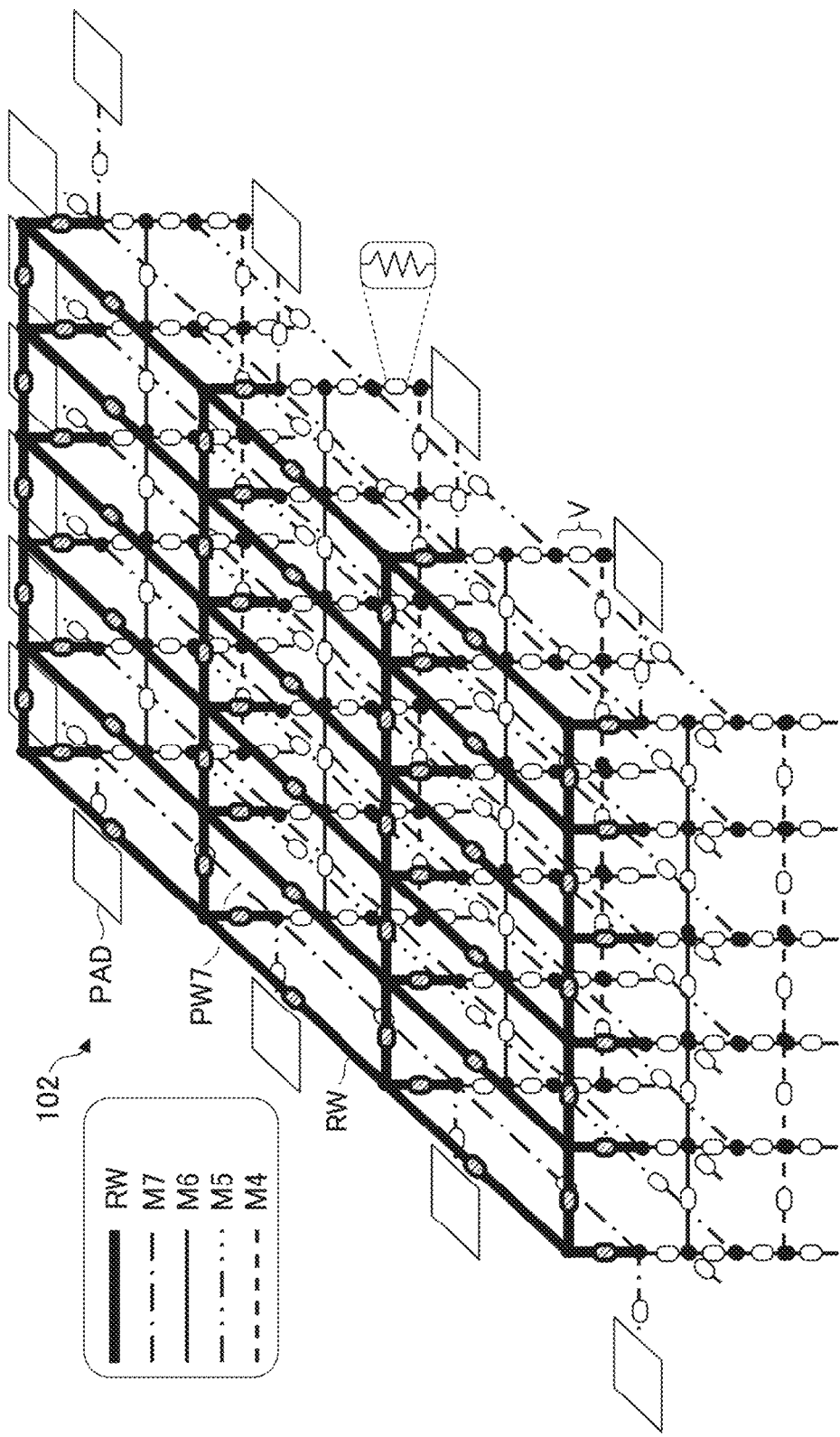
FIG. 26 is a schematic view illustrating an example of a resistance netlist of the power supply conductive trace structure of FIG. 25.

FIG. 26 illustrates an example of a resistance netlist of the power supply conductive trace structure of FIG. 25. FIG. 26 is similar to FIG. 3 except that the power supply conductive trace RW is arranged on the entire surface of the semiconductor device 102. In a case where the number of electric current paths are increased by arranging the power supply conductive trace RW in the mesh form in the redistribution layer RDL as illustrated in FIG. 26, the power supply resistances are evenly distributed in a manner similar to a bridge circuit. In this case, electric currents flowing to respective portions of the power supply conductive trace PW are kept uniform, and therefore, the amount of electric power supply current supplied to the circuit corresponding to the location in which the dynamic voltage drop greater than expected occurs cannot be increased. Therefore, in the power supply conductive trace structure as illustrated in FIG. 26, the dynamic voltage drop that occurs locally cannot be alleviated.

Figure 27:
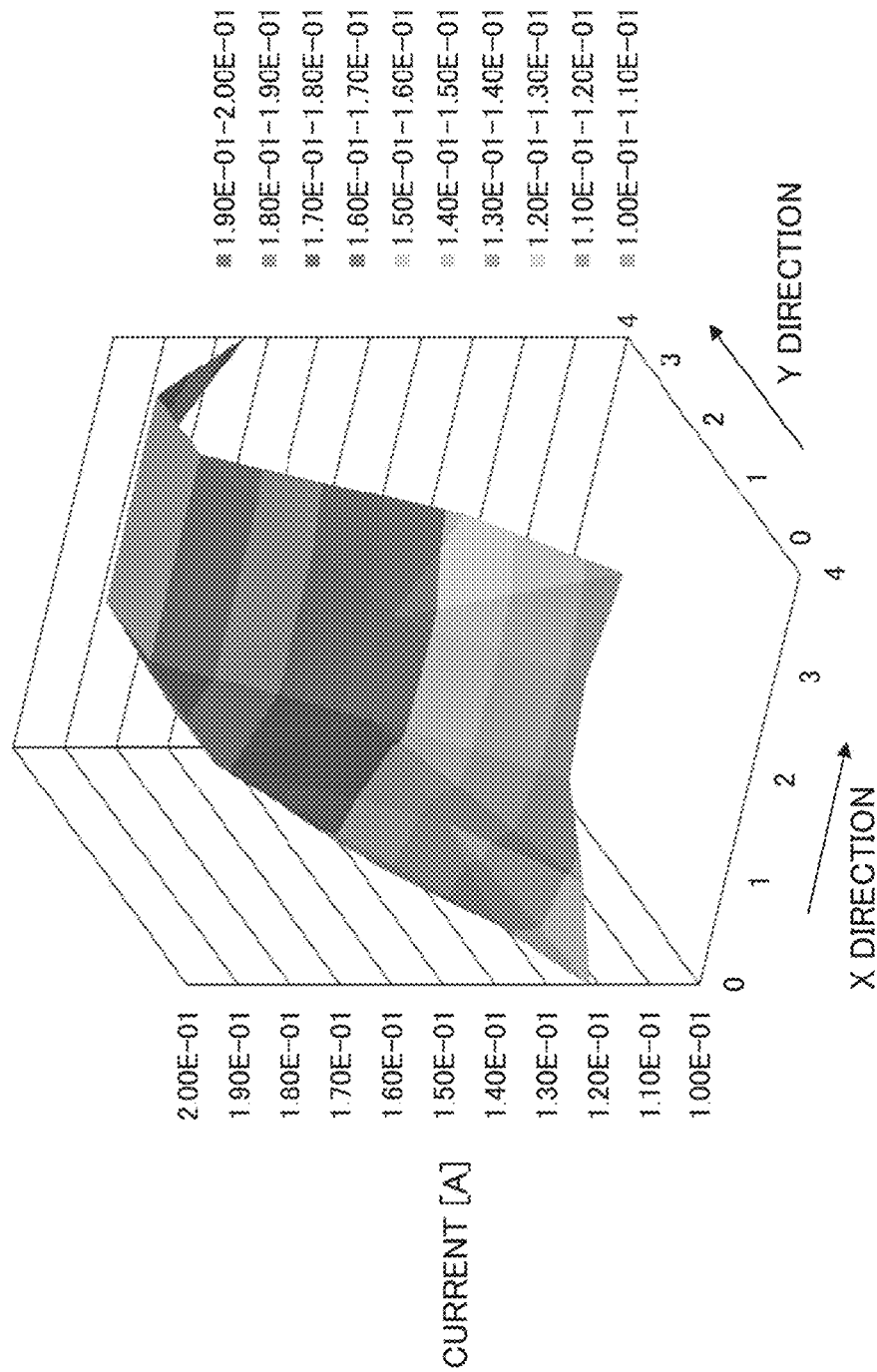
FIG. 27 is a three-dimensional graph illustrating a simulation result of load variation of the semiconductor device having the power supply conductive trace structure of FIG. 24.
Figure 28:
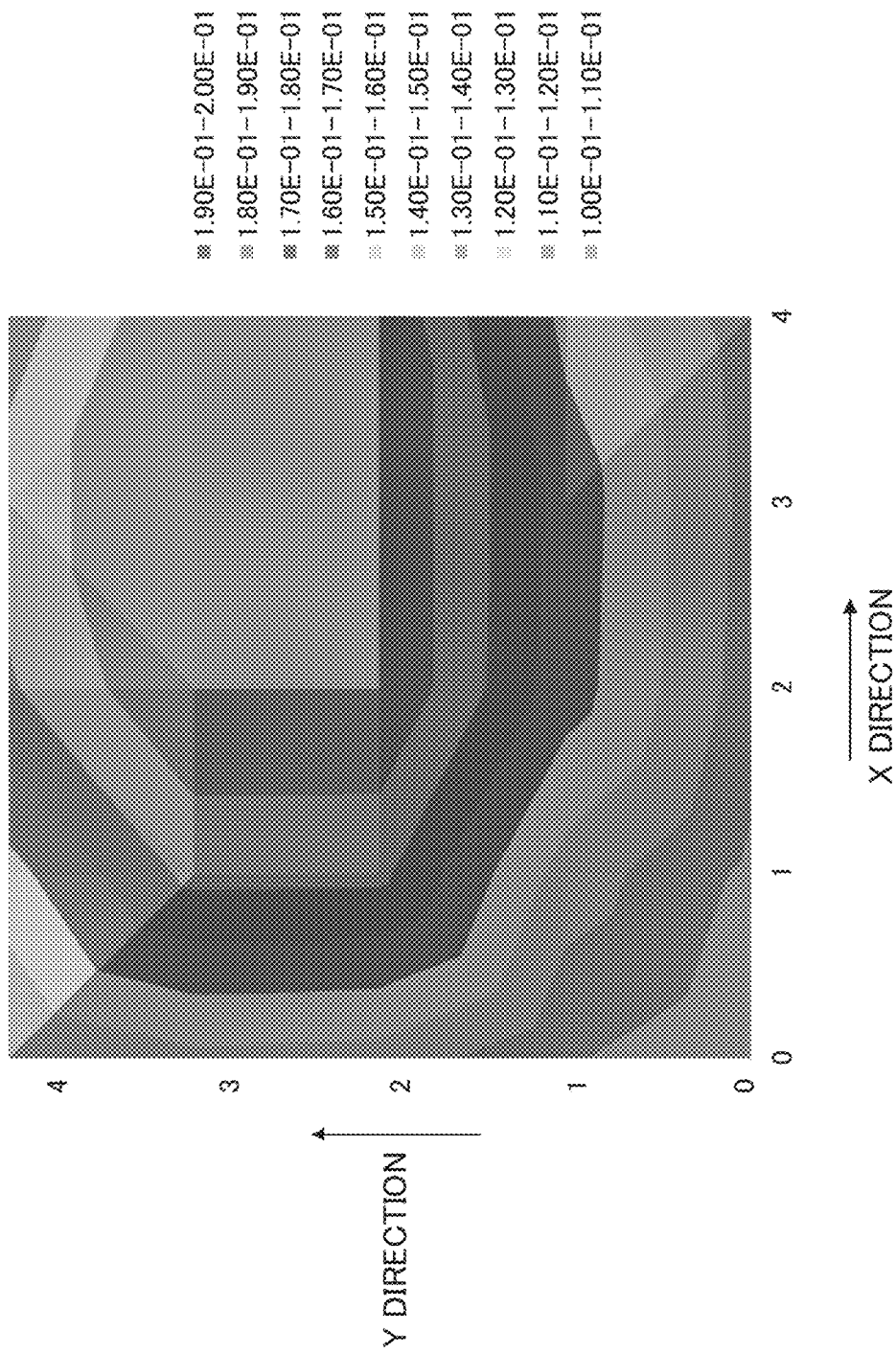
FIG. 28 is a two-dimensional graph illustrating a simulation result of load variation of the semiconductor device having the power supply conductive trace structure of FIG. 24.

FIG. 27 and FIG. 28 illustrate simulation results (a three-dimensional graph and a two-dimensional graph) of load variation of the semiconductor device having the power supply conductive trace structure of FIG. 24. FIG. 27 and FIG. 28 correspond to FIG. 9 and FIG. 10, respectively, and the simulation results are substantially the same as FIG. 9 and FIG. 10.

Figure 29:
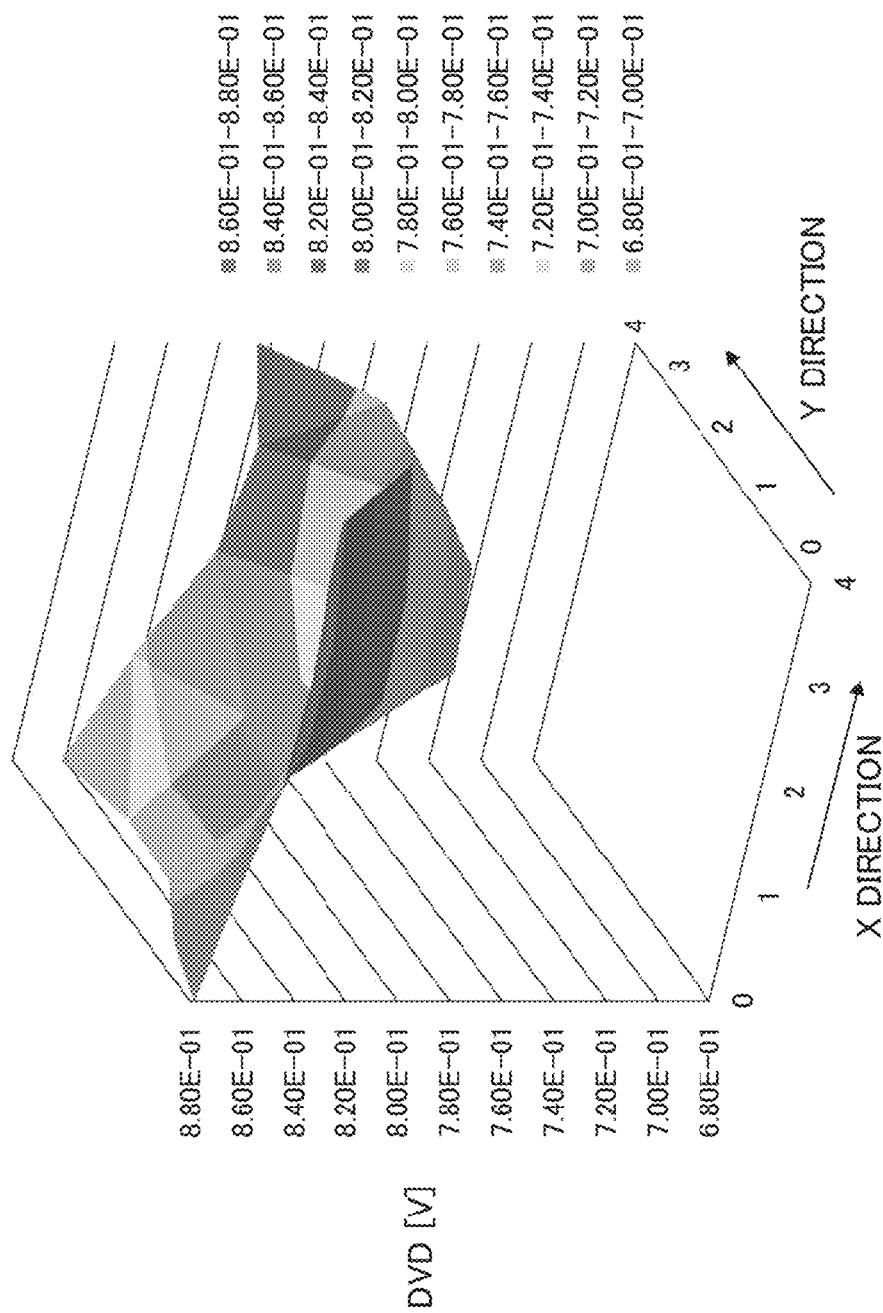
FIG. 29 is a three-dimensional graph illustrating a simulation result of dynamic voltage drop of the semiconductor device having the power supply conductive trace structure of FIG. 24.

FIG. 29 and FIG. 30 illustrate simulation results (a three-dimensional graph and a two-dimensional graph) of dynamic voltage drop of the semiconductor device having the power supply conductive trace structure of FIG. 24. FIG. 29 and FIG. 30 correspond to FIG. 11 and FIG. 12, respectively, and the simulation results are substantially the same as FIG. 11 and FIG. 12, respectively.

FIG. 31 illustrates a simulation result of temporal change of dynamic voltage drop of the semiconductor device having the power supply conductive trace structure of FIG. 24. FIG. 31 corresponds to FIG. 13, and the simulation result is substantially the same as FIG. 13.

The present invention has been described above based on the embodiments, but the present invention is not limited to the above embodiments. The features explained in the above embodiments can be changed without departing from the scope of the subject matter set forth in the appended claims, and can be appropriately determined according to the implementation to which the present invention is applied.

According to the disclosed technique, local voltage drop in a semiconductor device can be alleviated with less increase in the designing cost.

Although the present invention has been described above with reference to the embodiments, the present invention is not limited to the features described in the embodiments. These features can be changed without departing from the scope of the claimed subject matter, and can be appropriately determined according to the implementation to which the present invention is applied.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power supply conductive trace structure of a semiconductor device, comprising:
    a first power supply conductive trace in a mesh form provided in a first power supply conductive trace layer; and
    a second power supply conductive trace provided in a redistribution layer located on or above the first power supply conductive trace, the second power supply conductive trace being electrically coupled in parallel with the first power supply conductive trace to correspond in position to a conductive trace area that is a portion of the first power supply conductive trace.

2. The power supply conductive trace structure of the semiconductor device according to claim 1, further comprising:
    a third power supply conductive trace provided in a second power supply conductive trace layer located at a position on a lower side of the first power supply conductive trace layer,
    wherein:
    the first power supply conductive trace is connected to the third power supply conductive trace through vias, and
    a density of the vias provided, between the first power supply conductive trace layer and the second power supply conductive trace layer, in a first area located around the conductive trace area is configured to be higher than a density of vias provided in an area other than the first area.

3. The power supply conductive trace structure of the semiconductor device according to claim 2, wherein a density of the vias provided, between the first power supply conductive trace layer and the second power supply conductive trace layer, in a second area located around the first area is configured to be lower than a density of the vias provided in an area other than the second area.

4. The power supply conductive trace structure of the semiconductor device according to claim 3, wherein the first area and the second area are provided in a band shape around the conductive trace area.

5. A power supply conductive trace layout method of a semiconductor device including a first power supply conductive trace in a mesh form provided in a first power supply conductive trace layer,
    the power supply conductive trace layout method comprising:
    detecting, through a simulation, a conductive trace area in which a voltage drop occurs due to an electric power supply current flowing in the first power supply conductive trace; and
    arranging a second power supply conductive trace provided in a redistribution layer located on or above the first power supply conductive trace, the second power supply conductive trace being electrically coupled in parallel with the first power supply conductive trace to correspond in position to a conductive trace area that is a portion of the first power supply conductive trace.

6. The power supply conductive trace layout method of the semiconductor device according to claim 5, wherein the detecting of the conductive trace area in which the voltage drop occurs through the simulation and the arranging of the second power supply conductive trace are performed in a case where an operation failure occurs in an operation test of a second semiconductor device that includes the first power supply conductive trace in the mesh form but that does not include the second power supply conductive trace.

7. The power supply conductive trace layout method of the semiconductor device according to claim 5, further comprising:
    arranging vias connecting the first power supply conductive trace and a third power supply conductive trace with each other, the third power supply conductive trace being provided in a second power supply conductive trace layer located at a position on a lower side of the first power supply conductive trace layer; and
    configuring a density of the vias provided, between the first power supply conductive trace layer and the second power supply conductive trace layer, in a first area located around the conductive trace area to be higher than a density of vias provided in an area other than the first area.

8. The power supply conductive trace layout method of the semiconductor device according to claim 7, further comprising:

configuring a density of the vias provided, between the first power supply conductive trace layer and the second power supply conductive trace layer, in a second area located around the first area to be lower than a density of vias provided in an area other than the second area.

9. The power supply conductive trace layout method of the semiconductor device according to claim 8, wherein the first area and the second area are configured to be in a band shape around the conductive trace area.

* * * * *